(12) United States Patent
Na et al.

(10) Patent No.: US 10,692,543 B2
(45) Date of Patent: Jun. 23, 2020

(54) SEMICONDUCTOR PACKAGES, STORAGE DEVICES INCLUDING THE SAME, AND METHOD OF OPERATING THE SEMICONDUCTOR PACKAGES

(71) Applicant: SAMSUNG ELECTRONICS CO., LTD., Suwon-si, Gyeonggi-Do (KR)

(72) Inventors: Young-Ho Na, Seoul (KR); Young-Sun Min, Hwaseong-si (KR); Dae-Seok Byeon, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/363,307

(22) Filed: Mar. 25, 2019

(65) Prior Publication Data
US 2020/0105308 A1   Apr. 2, 2020

(30) Foreign Application Priority Data

Sep. 27, 2018 (KR) .......................... 10-2018-0114656

(51) Int. Cl.
| | |
|---|---|
| *G11C 5/05* | (2006.01) |
| *G11C 5/02* | (2006.01) |
| *G11C 16/04* | (2006.01) |
| *H01L 25/065* | (2006.01) |
| *G11C 16/08* | (2006.01) |
| *G06F 1/324* | (2019.01) |
| *G06F 1/32* | (2019.01) |
| *H05K 1/00* | (2006.01) |

(52) U.S. Cl.
CPC .......... *G11C 5/025* (2013.01); *G11C 16/0441* (2013.01); *G11C 16/0466* (2013.01); *G11C 16/0483* (2013.01); *G11C 16/08* (2013.01); *H01L 25/0657* (2013.01); *G06F 1/32* (2013.01); *G06F 1/324* (2013.01); *H05K 1/00* (2013.01)

(58) Field of Classification Search
CPC ..... G11C 5/025; G11C 16/0466; G11C 16/08; G11C 16/0441; G11C 16/0483; H01L 25/0657; G06F 1/32; G06F 1/324; H05K 1/00
See application file for complete search history.

(56) References Cited

U.S. PATENT DOCUMENTS

| | | | |
|---|---|---|---|
| 5,561,373 A | 10/1996 | Itoh | |
| 7,880,244 B2 | 2/2011 | Kierse | |
| (Continued) | | | |

*Primary Examiner* — Ajay Ojha
(74) *Attorney, Agent, or Firm* — F. Chan & Associates, LLC

(57) ABSTRACT

A semiconductor package includes first through third memory chips. The first memory chip is arranged on a package substrate, the second memory chip is arranged on the first memory chip, and the third memory chip is arranged between the first memory chip and the second memory chip. Each of the first through third memory chips includes a memory cell array storing data, stress detectors, a stress index generator, and a control circuit. The stress detectors are formed and distributed in a substrate, and detect stacking stress in response to an external voltage to output a plurality of sensing currents. The stress index generator converts the plurality of sensing currents into stress index codes. The control circuit adjusts a value of a feature parameter associated with an operating voltage of a corresponding memory chip, based on at least a portion of the stress index codes.

20 Claims, 21 Drawing Sheets

(56) References Cited

U.S. PATENT DOCUMENTS

| | | |
|---|---|---|
| 8,159,825 B1 | 4/2012 | Dotsenko |
| 8,223,524 B2 | 7/2012 | Chung |
| 8,493,250 B2 | 7/2013 | Bonaccio et al. |
| 8,937,255 B1 | 1/2015 | Dotsenko |
| 9,156,673 B2 | 10/2015 | Bryzek et al. |
| 9,817,041 B2 | 11/2017 | Yin |
| 2002/0173858 A1 | 11/2002 | Sherlock |
| 2004/0163843 A1* | 8/2004 | Shin .................. H01L 23/3135 174/254 |
| 2019/0204893 A1* | 7/2019 | Rotem ................. G06F 1/3287 |

\* cited by examiner

SEMICONDUCTOR PACKAGES, STORAGE DEVICES INCLUDING THE SAME, AND METHOD OF OPERATING THE SEMICONDUCTOR PACKAGES

CROSS-REFERENCE TO RELATED APPLICATION

This U.S. non-provisional application claims priority under 35 U.S.C. § 119 to Korean Patent Application No. 10-2018-0114656, filed on Sep. 27, 2018 in the Korean Intellectual Property Office (KIPO), the disclosure of which is incorporated by reference herein in its entirety.

TECHNICAL FIELD

Exemplary embodiments of the inventive concept relate generally to data storage devices, and more particularly to a semiconductor package, a storage device including the same, and a method of operating the semiconductor package.

DISCUSSION OF RELATED ART

A mass storage device such as a solid state drive (SSD) includes multi-stack chip packages, in which a plurality of semiconductor devices are stacked, to store data. In general, each multi-stack chip package may be connected to a controller through one common channel. A considerable quantity of thermal stress and mechanical stress may be applied to a semiconductor package in the process of manufacturing a multi-stack chip package when semiconductor chips are stacked on a package board. Intrinsic parameters of a package, such as an internal voltage, a program voltage, or an erase voltage of a semiconductor chip, may be changed due to this stress, regardless of the intent of a memory vendor. The change of the intrinsic parameters may cause a serious error with respect to an operation of a data storage device including the package.

SUMMARY

According to an exemplary embodiment of the inventive concept, a semiconductor package includes first through third memory chips. The first memory chip is arranged on a package substrate, the second memory chip is arranged on the first memory chip, and the third memory chip is arranged between the first memory chip and the second memory chip. Each of the first through third memory chips includes a memory cell array storing data, a plurality of stress detectors, a stress index generator, and a control circuit. The plurality of stress detectors are formed and distributed in a substrate, and detect stacking stress in response to an external voltage to output a plurality of sensing currents. The stress index generator converts the plurality of sensing currents into stress index codes. The control circuit adjusts a value of a feature parameter associated with an operating voltage of a corresponding memory chip, based on at least a portion of the stress index codes.

According to an exemplary embodiment of the inventive concept, a storage device includes a semiconductor package including first through third memory chips, and a storage controller controlling the first through third memory chips. The first memory chip is arranged on a package substrate, the second memory chip is arranged on the first memory chip, and the third memory chip is arranged between the first memory chip and the second memory chip. Each of the first through third memory chips includes a memory cell array storing data, a plurality of stress detectors, a stress index generator, and a control circuit. The plurality of stress detectors are formed and distributed in a substrate, and detect stacking stress in response to an external voltage to output a plurality of sensing currents. The stress index generator converts the plurality of sensing currents into stress index codes. The control circuit adjusts a value of a feature parameter associated with an operating voltage of a corresponding memory chip, based on at least a portion of the stress index codes.

According to an exemplary embodiment of the inventive concept, in a method of operating a semiconductor package, a wafer including a plurality of dies which are distinguished by scribe lanes is provided, memory chips are formed in the plurality of dies, stress is detected by each of a plurality of stress detectors, which are formed and distributed in a substrate of each of the memory chips, the detected stress is converted to digital codes in each of the memory chips to store the digital codes inside of each of the memory chips as reference stress index codes, the dies are singulated from one another by cutting along the scribe lanes, the singulated dies are stacked to perform a packing process on the stacked singulated dies, at least a portion of stress index codes is compared with a corresponding portion of the reference stress index codes to generate a compensation code, where the stress index codes are converted based on stacking stress detected by the plurality of stress detectors in each of the memory chips, and a value of a feature parameter of each of the memory chips is adjusted based on the compensation code in each of the memory chips.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EXEMPLARY EMBODIMENTS

Figure 1:
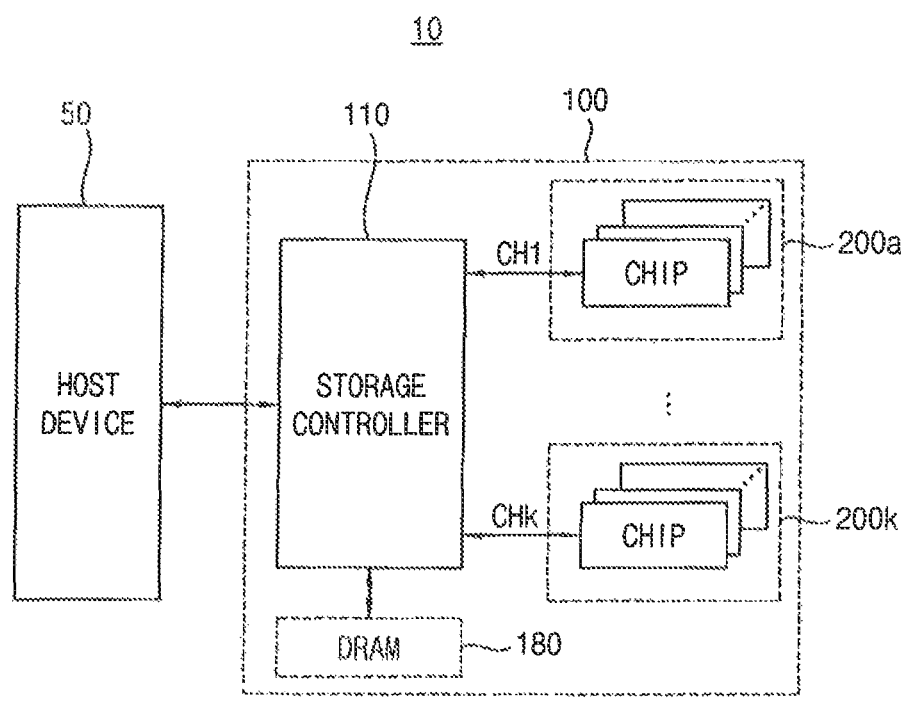
FIG. 1 is a block diagram illustrating a storage system according to an exemplary embodiment of the inventive concept.

Exemplary embodiments of the inventive concept are directed to a semiconductor package with increased reliability.

Exemplary embodiments of the inventive concept are also directed to a storage device including the semiconductor package with increased reliability.

Exemplary embodiments of the inventive concept are further directed to a method of operating the semiconductor package with increased reliability.

Exemplary embodiments of the inventive concept will be described more fully hereinafter with reference to the accompanying drawings. Like reference numerals may refer to like elements throughout this application.

FIG. 1 is a block diagram illustrating a storage system according to an exemplary embodiment of the inventive concept.

Referring to FIG. 1, a storage system 10 includes a host device 50 and a storage device 100 that may interface with the host device 50.

The host device 50, for example, may control overall operation of the storage device 100. The host device 50 may exchange signals with the storage device 100. The signals exchanged between the host device 50 and the storage device 100 may include, for example, a command signal, an address signal, data signals, etc.

The storage device 100 may include a storage controller 110 and a plurality of semiconductor packages 200a~200k. Each of the plurality of semiconductor packages 200a~200k may be implemented with a plurality of memory chips which are sequentially stacked, and each of the memory chips may be implemented with a nonvolatile memory device. Each of the semiconductor packages 200a~200k may be referred to as a multi-stack chip package.

The storage controller 110 may control overall operation of the storage device 100. The storage controller 110 may exchange signals such as the command signal, the address signal, the data signals, etc. with the host device 50. The storage controller 110 may write data in a corresponding semiconductor package. In addition, the storage controller 110 may read data from a corresponding semiconductor package in response to a command.

The storage device 100 may further include a dynamic random access memory (DRAM) 180 connected to the storage controller 110. The DRAM 180 may be used as a buffer area for temporarily storing data received from the host device 50 or temporarily storing data read from the semiconductor packages 200a~200k. The DRAM 180 may also be used to drive software used for effective management of the semiconductor packages 200a~200k. The DRAM 180 may be used to store metadata received from the host device 50 and/or may be used to store cache data.

The semiconductor packages 200a~200k may be connected to the storage controller 110 through a plurality of channels CH1~CHk, respectively. The semiconductor package 200a may be connected to the storage controller 110 through the channel CH1 and the semiconductor package 200k may be connected to the storage controller 110 through the channel CHk.

Figure 2:
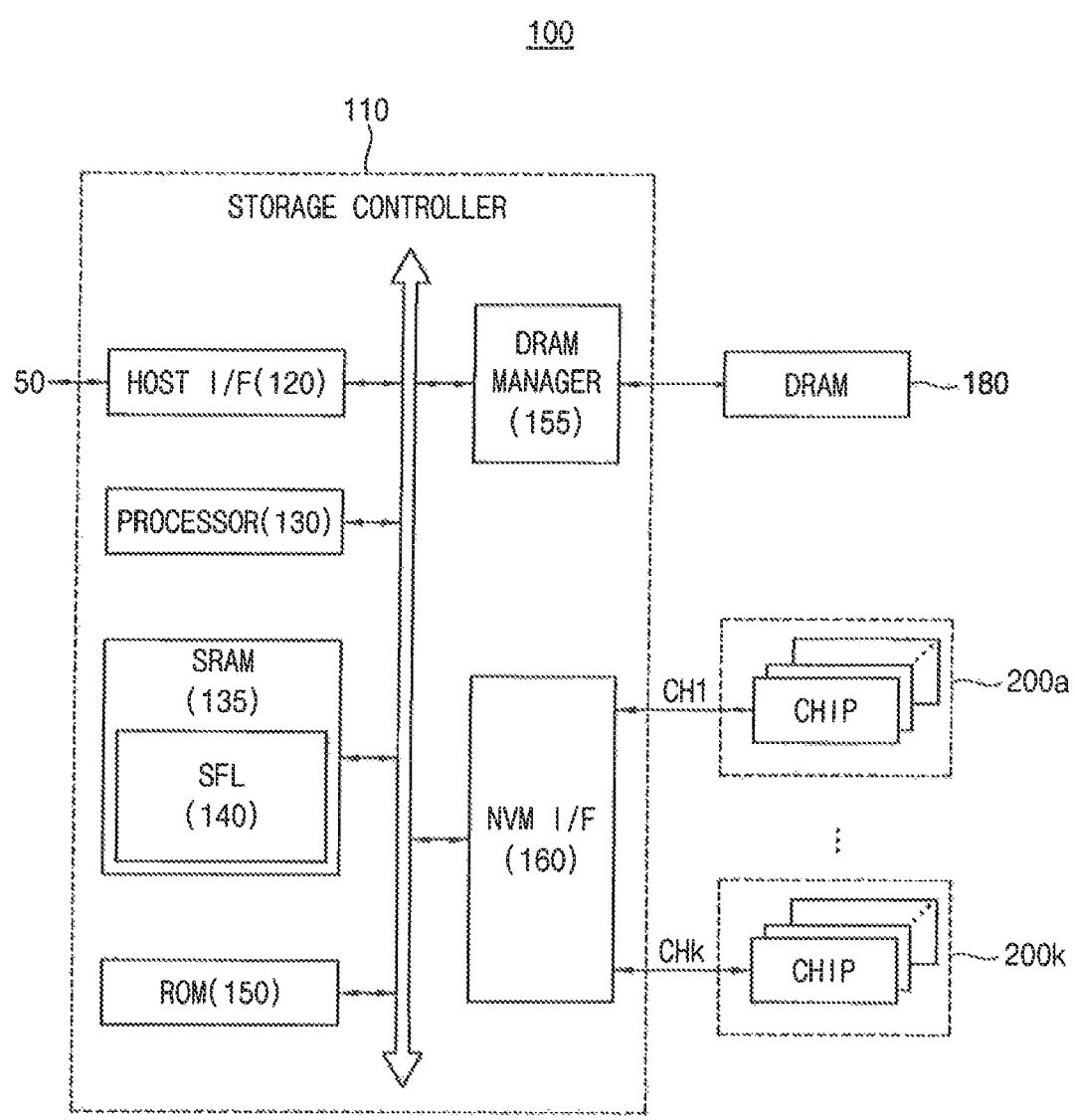
FIG. 2 is a block diagram illustrating the storage device of FIG. 1 according to an exemplary embodiment of the inventive concept.

FIG. 2 is a block diagram illustrating a storage device of FIG. 1 according to an exemplary embodiment of the inventive concept.

Referring to FIG. 2, the storage device 100 may include the storage controller 110, the plurality of semiconductor packages 200a~200k, and the DRAM 180. The storage controller 110 may include a host interface 120, a processor 130, a static random access memory (SRAM) 135, a read only memory (ROM) 150, a DRAM manager 155, and a nonvolatile memory interface 160.

The host interface 120 may provide an interface between the host device 50 and the storage controller 110. The host device 50 and the storage controller 110 may be connected through at least one of various standardized interfaces. The standardized interfaces may include various interfaces such as an advanced technology attachment (ATA), a serial ATA (SATA), an external SATA (e-SATA), a small computer system interface (SCSI), a serial attached SCSI (SAS), a peripheral component interconnect (PCI), a PCI Express (PCI-E), a universal serial bus (USB), a nonvolatile memory express (NVMe), or the like.

The processor 130 may perform an overall operation of the storage controller 110. The processor 130 may drive a variety of firmware needed to operate the storage device 100. Such firmware may include a flash translation layer (FTL), etc. The firmware such as the FTL may be loaded on the SRAM 135, and the firmware loaded on the SRAM 135 may be driven by the processor 130. The SRAM 135 may store stress profile (SFL) 140 associated with stacking stress based on a distance from an edge of a substrate of memory chips included in each of the semiconductor packages 200a~200k. The stored stress profile 140 may be provided to the host device 50, and may be used for arranging memory chips which will be manufactured later. In other words, an available area in which circuits are arranged in a substrate is limited due to the stacking stress in the semiconductor package 200a, and an available area in which memory chips are stacked later may be increased by providing the stress profile 140 to a vendor.

Various firmware needed to operate the storage controller 110 may be stored in the ROM 150. For example, code data for an interface with the host may be stored in the ROM 150. The DRAM manager 155 may provide an interface between the storage controller 110 and the DRAM 180. The DRAM 180 may temporarily store data to be stored in the semiconductor packages 200a~200k and data read therefrom.

The nonvolatile memory interface 160 may provide an interface between the storage controller 110 and the semiconductor packages 200a~200k. The semiconductor packages 200a~200k may be connected to the nonvolatile memory interface 160 through the channels CH1~CHk, respectively. For example, the storage controller 110 may exchange data with each of memory chips constituting the semiconductor packages 200a~200k through the nonvolatile memory interface 160.

Figure 3:
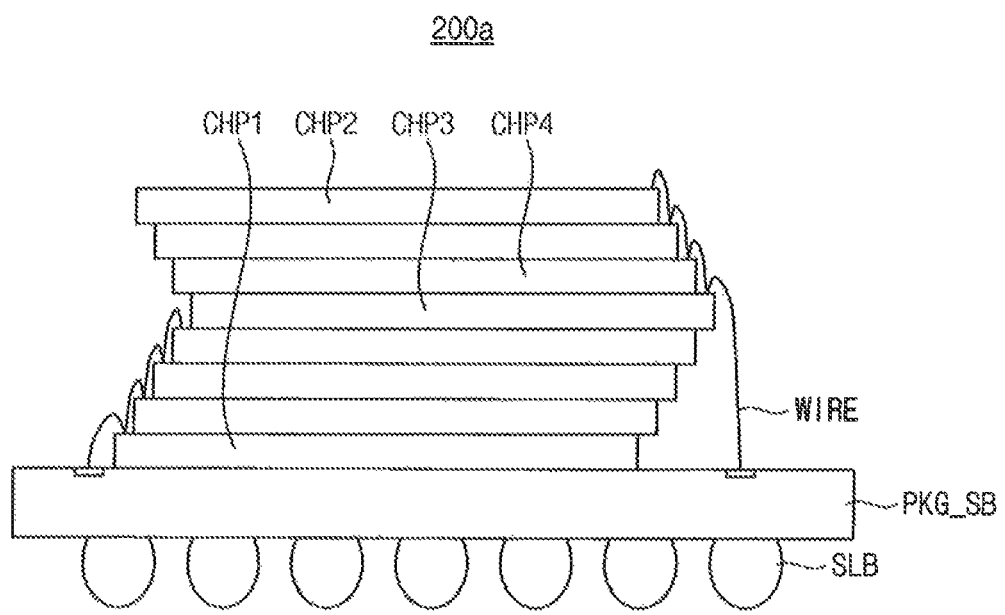
FIG. 3 is a block diagram illustrating a semiconductor package of FIG. 1 according to an exemplary embodiment of the inventive concept.

FIG. 3 is a block diagram illustrating a semiconductor package of FIG. 1 according to an exemplary embodiment of the inventive concept.

In FIG. 3, a first semiconductor package 200a is illustrated. The first semiconductor package 200a may include a package substrate PKG_SB and a plurality of memory chips.

The memory chips may be provided on the package substrate PKG_SB. Solder balls SLB may be connected to the package substrate PKG_SB. The exemplary embodiment illustrated in FIG. 3 shows the first semiconductor package 200a including eight memory chips. However, the number of memory chips is not limited thereto. As illustrated in FIG. 3, a first memory chip CHP1 may be a memory chip that is mounted directly on the package substrate PKG_SB. A second memory chip CHP2 may be a memory chip, which is arranged in the uppermost layer, from among the memory chips. A third chip CHP3 may be a memory chip that is arranged between the first memory chip CHP1 and the second memory chip CHP2. A fourth memory chip CHP4 may be a memory chip that is arranged on the third memory chip CHP3. This explanation (e.g., configuration) is applicable throughout this specification, and exemplary embodiments will be described on the basis of this explanation.

A plurality of memory chips may be connected to a shared channel (e.g., CH1 of FIG. 1) through wires WIRE. An exemplary embodiment is illustrated in FIG. 3 where a plurality of memory chips are mounted in a wire bonding manner on the package substrate PKG_SB. However, the plurality of memory chips may instead be mounted in a flip-chip manner on the package substrate PKG_SB. In addition, the first semiconductor package 200a may be a multi-stack chip package that is manufactured through various methods without being limited to the above-described exemplary embodiments. The first semiconductor package 200a may further include a molding film covering the plurality of memory chips.

Various mechanical or thermal stresses, which are generated in the process of manufacturing a semiconductor package, may be directly transferred to a plurality of memory chips therein. This may cause a variation of a physical characteristic of each memory chip. The physical characteristic may be a feature parameter and the feature parameter may include various voltages which the memory chip uses for performing a read operation, a program operation, and an erase operation. The feature parameter may further include voltages to drive a logic circuit (or peripheral circuits) included in the memory chip.

For example, the feature parameter may be a program voltage. A program voltage, which has a value different from that of a program voltage (e.g., a target value) originally designed by a memory vendor, may be generated in a semiconductor chip. The feature parameter may be changed in the process of assembling a semiconductor package in the storage device 100 (refer to FIG. 1) as well as in the process of manufacturing the semiconductor package. A shift of the feature parameter is illustrated in FIGS. 4 and 5.

Figure 4:
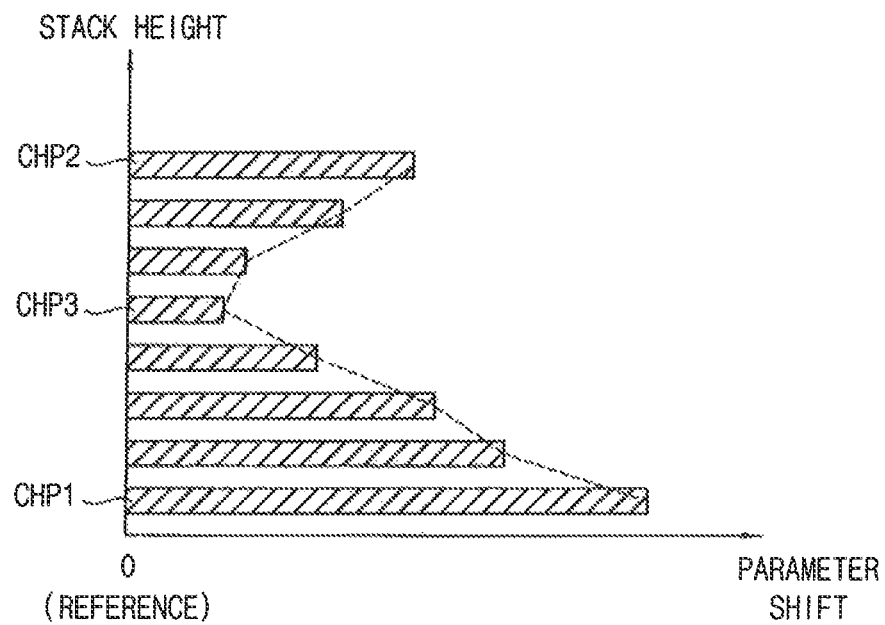
FIGS. 4 and 5 are graphs illustrating a shift of a feature parameter due to a semiconductor package manufacturing process or a semiconductor package assembling process according to exemplary embodiments of the inventive concept.
Figure 5:
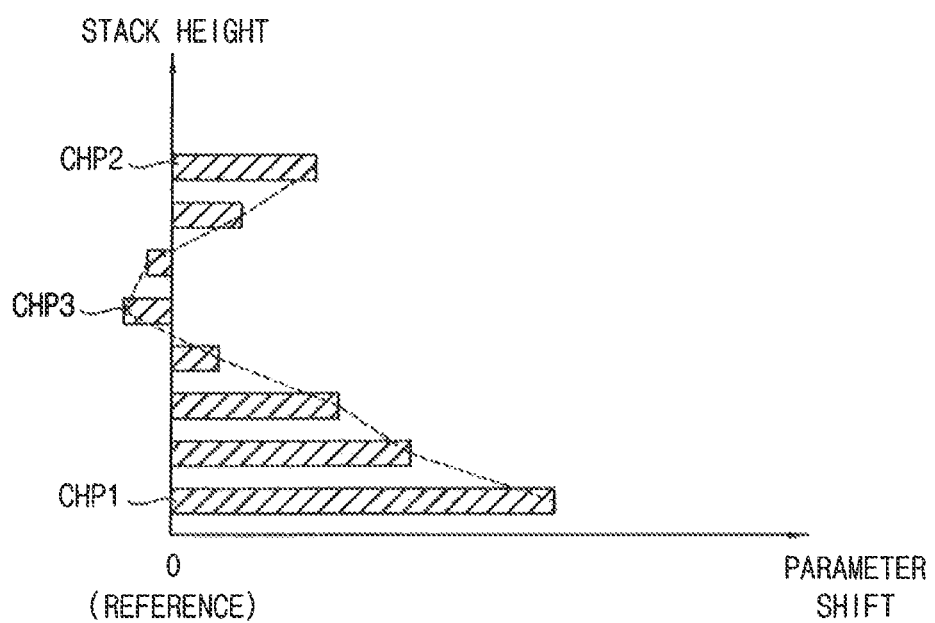

FIGS. 4 and 5 are graphs illustrating a shift of a feature parameter due to a semiconductor package manufacturing process or a semiconductor package assembling process according to exemplary embodiments of the inventive concept.

Referring to FIG. 4, the abscissa denotes a shift of a feature parameter. For example, a shift of the feature parameter equal to "0" in the process of manufacturing a semiconductor package means that no physical characteristic of a semiconductor chip changes. In this case, a value of a feature parameter (e.g., a program voltage), which is practically measured from a semiconductor chip, may be substantially the same as a target value originally designed by the memory vendor. When the feature parameter is greatly shifted, a physical characteristic of a semiconductor chip greatly changes and a probability that an error (e.g., a program fail) is generated due to the shifted feature parameter is high.

A shift of the feature parameter in a semiconductor package process may be the greatest at the lowermost chip (e.g., the first chip CHP1) directly mounted on a package substrate and the uppermost chip (e.g., the second chip CHP2) of a plurality of semiconductor chips. The shift of the feature parameter may be the smallest at a semiconductor chip (e.g., the third chip CHP3) that is located in the middle of the semiconductor chips. The shift of the feature parameter of each semiconductor chip having such a tendency is illustrated in FIGS. 4 and 5.

An example in which shifts of the feature parameters of all semiconductor chips are positive is illustrated in FIG. 4. However, the inventive concept is not limited thereto. For example, as illustrated in FIG. 5, shifts associated with some chips may be negative.

For example, in the case where the feature parameter is a program voltage, a negative shift of the feature parameter may mean that a program voltage, which is lower than a program voltage originally designed by the memory vendor, is generated. Shifts of the feature parameters of all chips may be negative. The overall tendency of the semiconductor chips as illustrated in FIG. 4 may be maintained even though some of the shifts of feature parameters associated with one package are negative or shifts of all feature parameters are negative. In exemplary embodiments of the inventive concept, therefore, a shift of a feature parameter of the third chip CHP3 may be smaller than shifts of feature parameters of the first and second chips CHP1 and CHP2.

Figure 6:
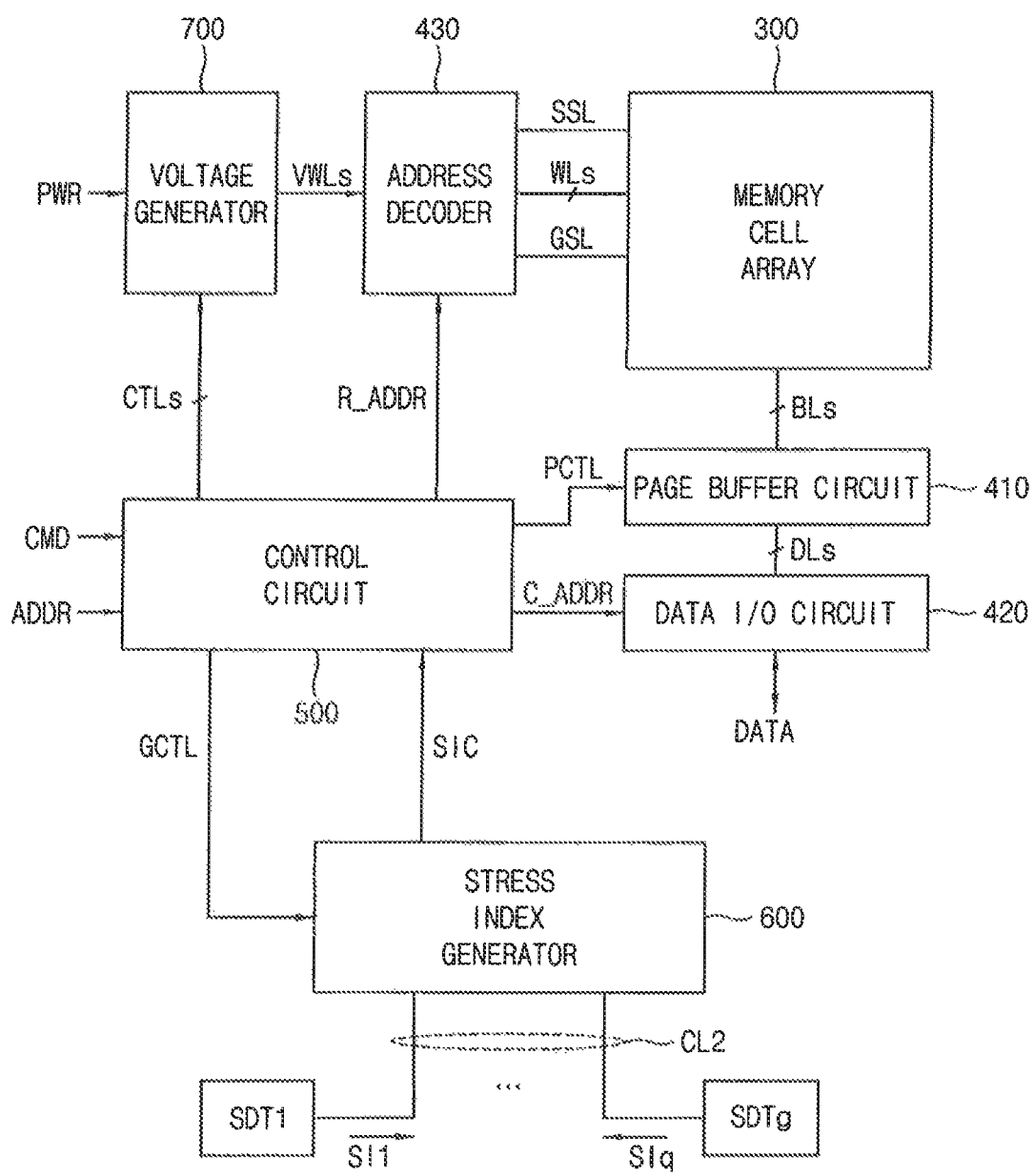
FIG. 6 is a block diagram illustrating a memory chip in the semiconductor package of FIG. 3 according to an exemplary embodiment of the inventive concept.

FIG. 6 is a block diagram illustrating a memory chip in the semiconductor package of FIG. 3 according to an exemplary embodiment of the inventive concept.

In FIG. 6, a configuration of the first memory chip CHP1 is illustrated and the first memory chip CHP1 is implemented with a nonvolatile memory device.

Referring to FIG. 6, the first memory chip CHP1 includes a memory cell array 300, an address decoder 430, a page buffer circuit 410, a data input/output circuit 420, a control circuit 500, a plurality of stress detectors SDT1~SDTg, a stress index generator 600, and a voltage generator 700. The stress detectors SDT1~SDTg are formed in a substrate and are distributed in the substrate.

The memory cell array 300 may be coupled to the address decoder 430 through a string selection line SSL, a plurality of word-lines WLs, and a ground selection line GSL. In addition, the memory cell array 300 may be coupled to the page buffer circuit 410 through a plurality of bit-lines BLs.

The memory cell array 300 may include, for example, a plurality of memory cells coupled to the plurality of word-lines WLs and the plurality of bit-lines BLs.

In exemplary embodiments of the inventive concept, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell.

Figure 7:
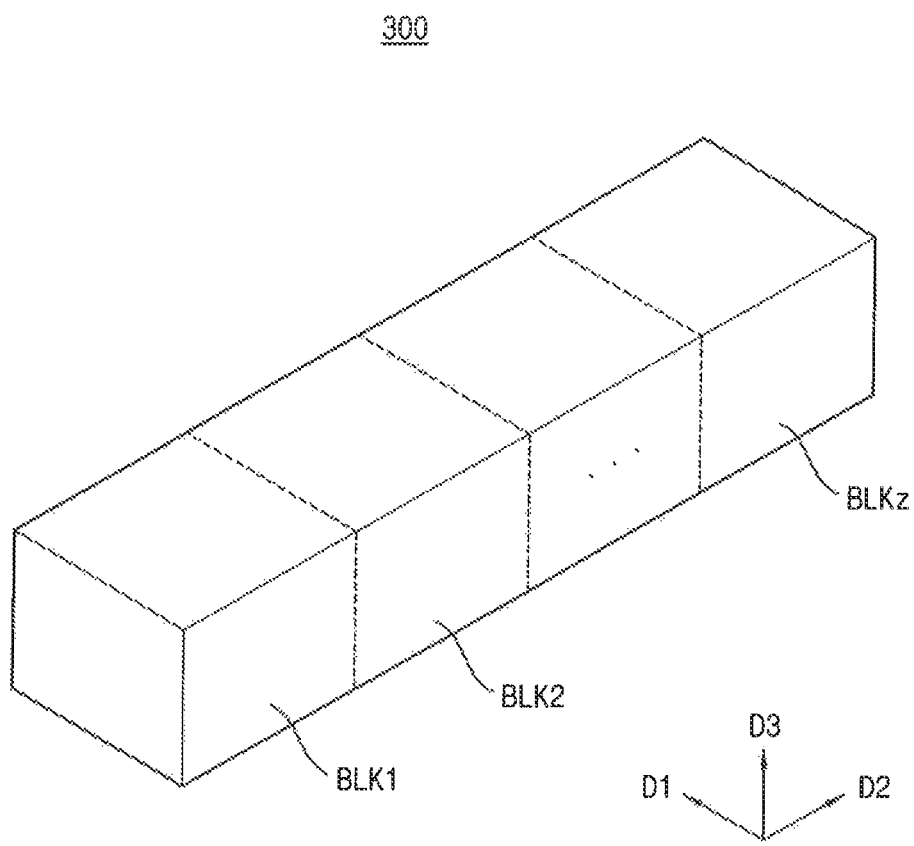
FIG. 7 is a block diagram illustrating a memory cell array of FIG. 6 according to an exemplary embodiment of the inventive concept.

FIG. 7 is a block diagram illustrating a memory cell array of FIG. 6 according to an exemplary embodiment of the inventive concept.

Referring to FIG. 7, the memory cell array 300 may include a plurality of memory blocks BLK1 to BLKz which extend along first through third directions D1, D2 and D3. In an exemplary embodiment of the inventive concept, the memory blocks BLK1 to BLKz are selected by the address decoder 430 in FIG. 6. For example, the address decoder 430 may select a memory block BLKi corresponding to a block address selected from among the memory blocks BLK1 to BLKz.

Figure 8:
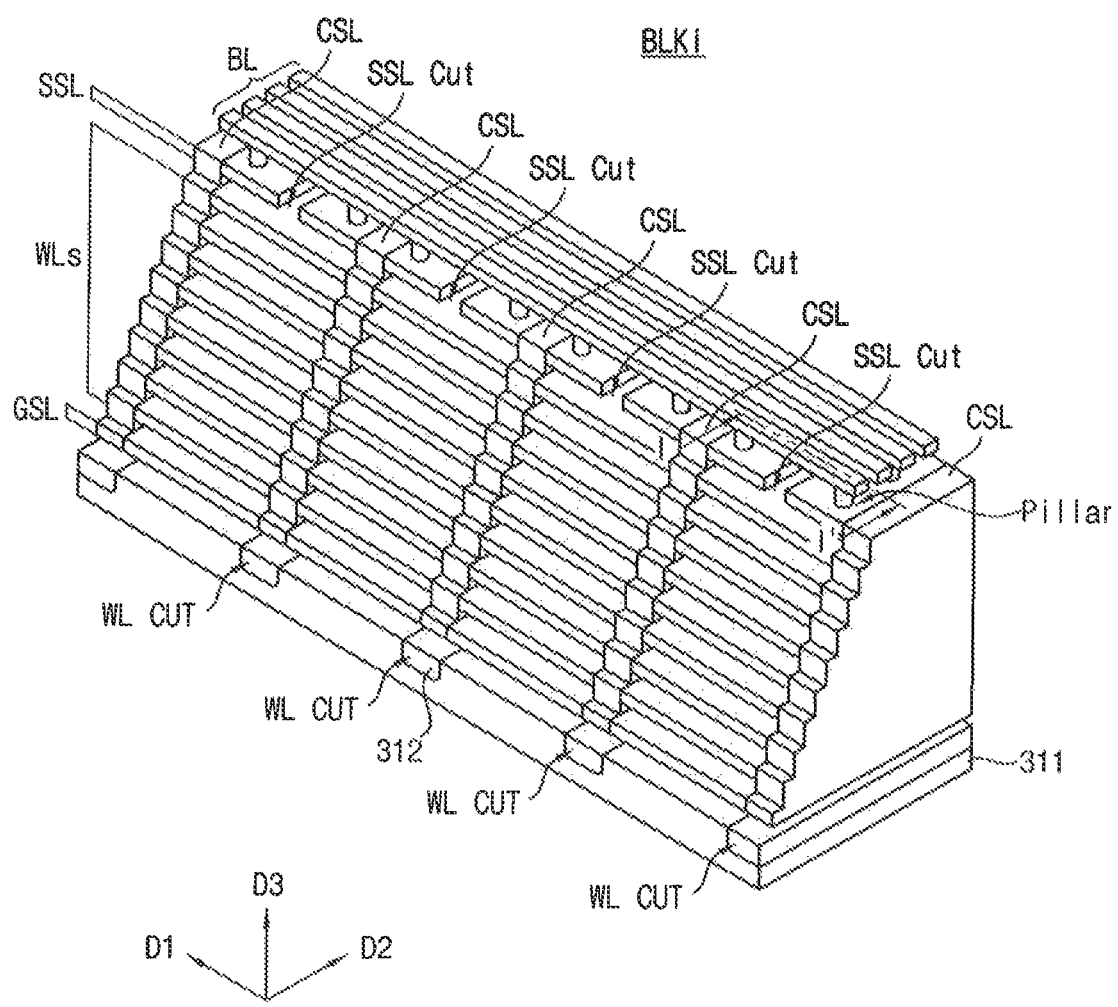
FIG. 8 is a perspective view illustrating a memory block of FIG. 7 according to an exemplary embodiment of the inventive concept.
Figure 9:
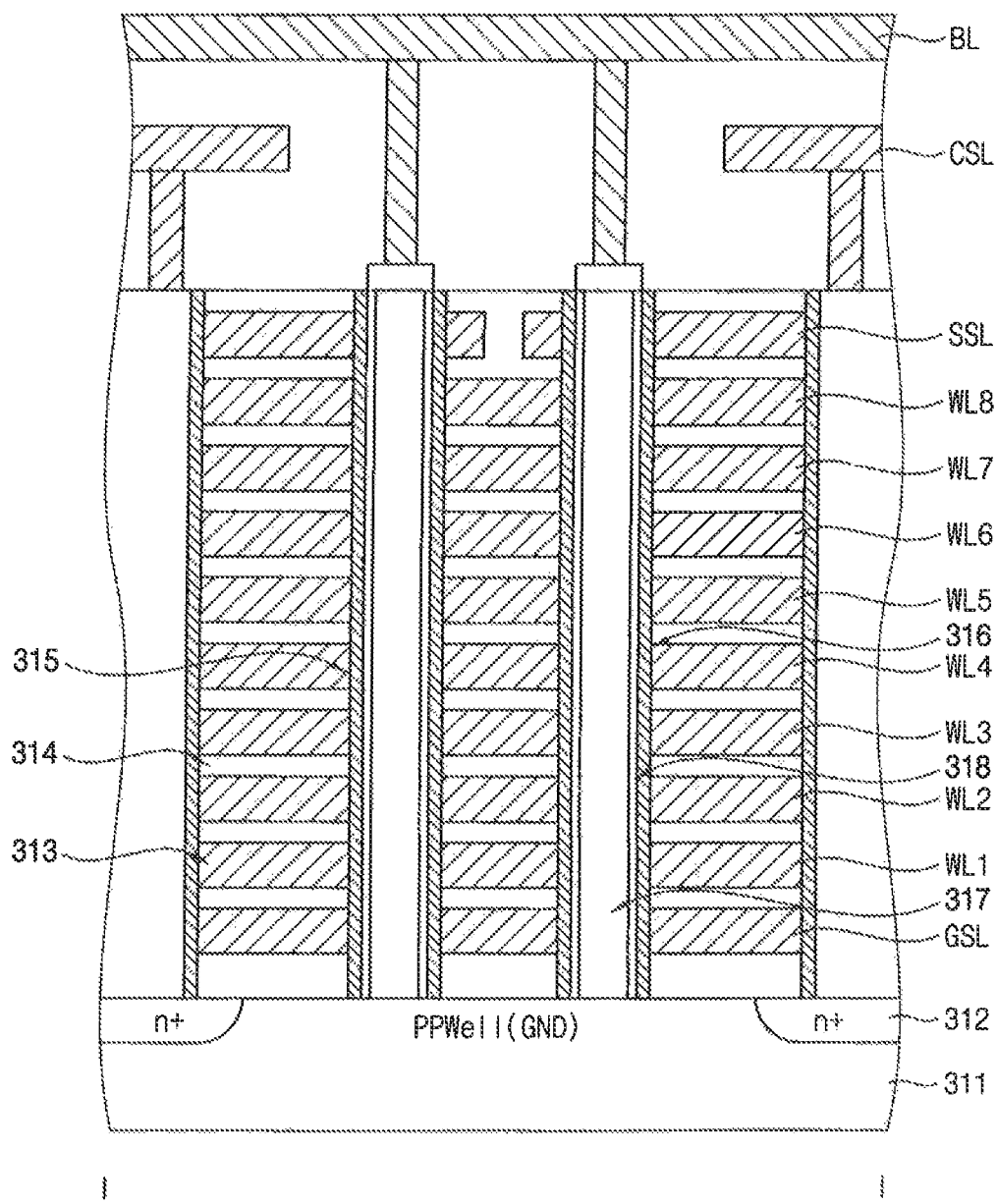
FIG. 9 is a cross-sectional view of the memory block of FIG. 8 taken along a line I-I' according to an exemplary embodiment of the inventive concept.

FIG. 8 is a perspective view illustrating a memory block of FIG. 7 according to an exemplary embodiment of the inventive concept and FIG. 9 is a cross-sectional view of the memory block of FIG. 8 taken along a line I-I' according to an exemplary embodiment of the inventive concept.

In FIGS. 8 and 9, a first direction corresponds to D1, a second direction corresponds to D2, and a third direction corresponds to D3. Referring to FIGS. 8 and 9, the memory block BLKi includes a substrate 311. The substrate 311 may be a well having a first conductivity type. The substrate 311 may be a p-well in which a Group III element, such as boron, is injected, for example. Hereafter, it is assumed that the substrate 311 is a p-well (or, a pocket p-well).

A plurality of doping regions 312 is provided on the substrate 311. The doping regions 312 extend along the second direction D2 and are spaced apart from one another along the first direction D1. For example, the doping regions 312 may be an n-type. Hereafter, it is assumed that the doping regions 312 are the n-type.

Four sub blocks are formed on the substrate 311. The sub blocks are formed by stacking and cutting at least one ground selection line GSL, a plurality of word lines WL, and at least one string selection line SSL on the substrate 311 in a plate shape. Here, the at least one string selection line SSL may be cut by string selection line cuts Cut. A common source line CSL may be formed in the form of a wall shape in each word line cut. In an exemplary embodiment of the inventive concept, the common source lines CSL included in word line cuts WL CUT may be interconnected.

A cell string may be formed by making a pillar connected to a bit line BL penetrate the at least one string selection line SSL, the plurality of word lines WL, and the at least one ground selection line GSL. A gate electrode layer 313 and an insulation layer 314 are deposited on the substrate 311 in turn. An information storage layer 315 is formed on lateral surfaces of the gate electrode layer 313 and the insulation layer 314.

The gate electrode layer 313 is connected to the ground selection line GSL, a plurality of word-lines WL1~WL8, and the string selection line SSL. The gate electrode layer 313 includes a metallic conductive material. Alternatively, the gate electrode layer 313 may include a non-metallic conductive material, such as polysilicon.

The information storage layer 315 includes a tunnel insulation layer, a charge storage layer, and a blocking insulation layer. The tunnel insulation layer may act as an insulation layer where charges move due to a tunneling effect. The charge storage layer may include an insulation layer that traps a charge. The charge storage layer may be formed of silicon nitride (SiN) or a metal (e.g., aluminum or hafnium) oxide layer. The blocking insulation layer may act as an insulation layer between the gate electrode layer and the charge storage layer. The blocking insulation layer may be formed of a silicon oxide layer. In an exemplary embodiment of the inventive concept, the tunnel insulation layer, the charge storage layer, and the blocking insulation layer may constitute an Oxide-Nitride-Oxide (ONO) structure of an insulation layer.

A pillar 316 is formed by vertically patterning the gate electrode layer 313 and the insulation layer 314. The pillar 316 penetrates the gate electrode layers 313 and the insulation layers 314 and is connected between the bit-line BL and the substrate 311. The pillar 316 includes a filling dielectric pattern 317 and a vertical active pattern 318. The filling dielectric pattern 317 contacts the substrate 311. The filling dielectric pattern 317 may include an insulation material such as silicon oxide or an air gap. The vertical active pattern 318 may include a channel semiconductor. In an exemplary embodiment of the inventive concept, the vertical active pattern 318 is formed of a p-type silicon layer.

A cell string may include a plurality of memory cells, a string selection transistor, and a ground selection transistor, which have substantially the same structure. The memory cells, the string selection transistor, and the ground selection transistor may be respectively formed of the filling dielectric pattern 317, the vertical active pattern 118, the information storage layer 315, and the gate electrode layer 313 that are sequentially formed from the inside of the pillar 316.

The common source lines CSL extend on the plurality of doping regions 312 (e.g., n+ doping regions). The common source lines CSL may be included in the word-line cuts WL CUT in the form of a wall.

Figure 10:
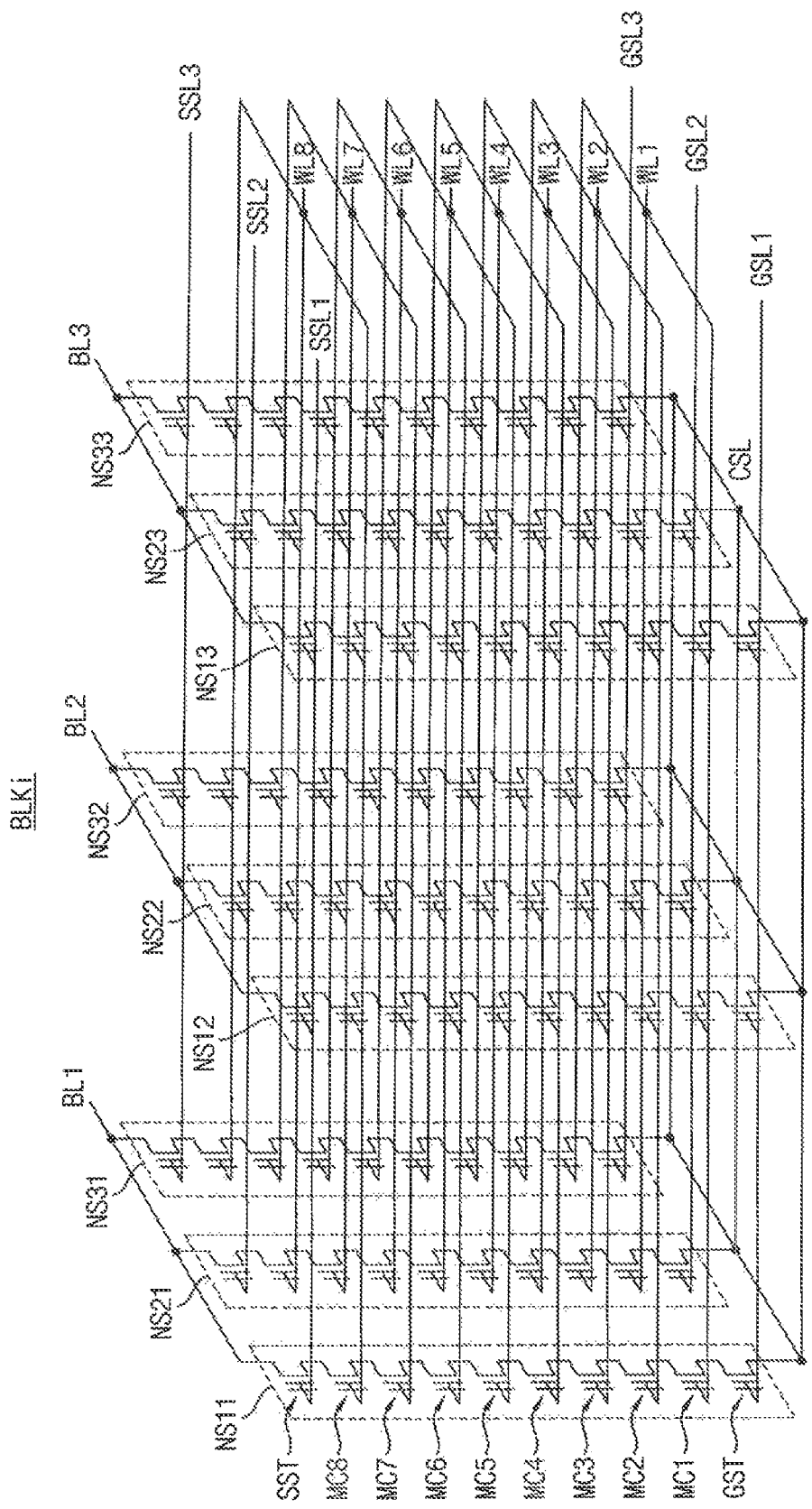
FIG. 10 is a circuit diagram illustrating the memory block of FIG. 7 according to an exemplary embodiment of the inventive concept.

FIG. 10 is a circuit diagram illustrating the memory block of FIG. 7 according to an exemplary embodiment of the inventive concept.

The memory block BLKi of FIG. 10 may be formed on a substrate in a three-dimensional structure (or a vertical structure). For example, a plurality of memory cell strings included in the memory block BLKi may be formed in a direction perpendicular to the substrate.

Referring to FIG. 10, the memory block BLKi may include memory cell strings NS11 to NS33 coupled between bit-lines BL1, BL2, and BL3 and the common source line CSL. Each of the memory cell strings NS11, NS21, NS31, NS12, NS22, NS32, NS13, NS23, and NS33 may include a string selection transistor SST, a plurality of memory cells MC1, MC2, MC3, MC4, MC5, MC6, MC7, and MC8, and a ground selection transistor GST. In FIG. 10, each of the memory cell strings NS11 to NS33 is illustrated to include eight memory cells MC1 to MC8. However, the inventive concept is not limited thereto. In exemplary embodiments of the inventive concept, each of the memory cell strings NS11 to NS33 may include any number of memory cells. Word lines WL1, WL2, WL3, WL4, WL5, WL6, WL7, and WL8 may be connected to respective memory cells.

The string selection transistor SST may be connected to corresponding string selection lines, for example SSL1, SSL2, and SSL3. The plurality of memory cells MC1 to MC8 may be connected to corresponding word-lines WL1 to WL8, respectively. The ground selection transistor GST may be connected to corresponding ground selection lines, for example, GSL1, GSL2, and GSL3. The string selection transistor SST may also be connected to corresponding bit-lines BL1, BL2, and BL3, and the ground selection transistor GST may be connected to the common source line CSL.

Word-lines (e.g., WL1) having substantially the same height may be commonly connected, and the ground selection lines GSL1, GSL2, and GSL3 and the string selection lines SSL1, SSL2, and SSL3 may be separated. In FIG. 10, the memory block BLKi is illustrated to be coupled to eight word-lines WL1 to WL8 and three bit-lines BL1 to BL3. However, the inventive concept is not limited thereto. In exemplary embodiments of the inventive concept, the memory cell array 300 may be coupled to any number of word-lines and bit-lines.

Referring back to FIG. 6, the control circuit 500 may receive a command (signal) CMD and an address (signal) ADDR from the storage controller 110, and may control an erase loop, a program loop, and a read operation of the first memory chip CHP1 based on the command signal CMD and the address signal ADDR. The program loop may include a program operation and a program verification operation. The erase loop may include, for example, an erase operation and an erase verification operation.

For example, the control circuit 500 may generate control signals CTLs, which are used for controlling the voltage generator 700, based on the command signal CMD, and generate a row address signal R_ADDR and a column address signal C_ADDR based on the address signal ADDR input to the control circuit 500. The control circuit 500 may provide the row address R_ADDR to the address decoder 430 and provide the column address C_ADDR to the data input/output circuit 420.

The address decoder 430 may be coupled to the memory cell array 300 through, for example, the string selection line SSL, the plurality of word-lines WLs, and the ground selection line GSL. During the program operation or the read operation, the address decoder 430 may determine one of the plurality of word-lines WLs as a first word-line (e.g., a selected word-line) and determine rest of the plurality of word-lines WLs except for the first word-line as unselected word-lines based on the row address R_ADDR.

The voltage generator 700 may generate word-line voltages (VWLs), which are required for operation of the first memory chip CHP1, based on the control signals CTLs. The voltage generator 700 may receive a power PWR from the storage controller 110. The word-line voltages VWLs may be applied to the plurality of word-lines WLs through the address decoder 430.

For example, during the erase operation, the voltage generator 700 may apply an erase voltage to a well of the memory block and may apply a ground voltage to entire word-lines of the memory block. During the erase verification operation, the voltage generator 700 may apply an erase verification voltage to the entire word-lines of the memory block or sequentially apply the erase verification voltage to word-lines on a word-line basis.

For example, during the program operation, the voltage generator 700 may apply a program voltage to the first word-line, and may apply a program pass voltage to the unselected word-lines that may activate memory cells associated with the unselected word lines, but not alter a program state of such memory cells.

In addition, during the program verification operation, the voltage generator 700 may apply a program verification voltage to the first word-line and may apply a verification pass voltage to the unselected word-lines.

In addition, during the read operation, the voltage generator 700 may apply a read voltage to the first word-line and may apply a read pass voltage to the unselected word-lines.

The page buffer circuit 410 may be coupled to the memory cell array 300 through the plurality of bit-lines BLs. The page buffer circuit 410 may include a plurality of page buffers. In exemplary embodiments of the inventive concept, one page buffer may be connected to one bit-line. In exemplary embodiments of the inventive concept, one page buffer may be connected to two or more bit-lines.

The page buffer circuit 410 may temporarily store data to be programmed in a selected page, or may have data read out from the selected page.

The data input/output circuit 420 may be coupled to the page buffer circuit 410 through data lines DL. During the program operation, the data input/output circuit 420 may receive data DATA from the storage controller 110 and provide the data DATA to the page buffer circuit 410 based on the column address C_ADDR received from the control circuit 500. During the read operation, the data input/output circuit 420 may provide the data DATA, which are stored in the page buffer circuit 410, to the storage controller 110 based on the column address C_ADDR received from the control circuit 500.

The stress detectors SDT1~SDTq may be formed in a first region near an edge region of the substrate in which the first memory chip CHP1 is formed, and may output sensing currents SI1~SIq, respectively, in response to an external voltage. The stress index generator 600 may receive the sensing currents SR~SIg, may convert the sensing currents SI1~SIq to corresponding stress index codes SIC, and may provide the stress index codes SIC to the control circuit 500.

The control circuit 500 may adjust a value of a feature parameter associated with the first memory chip CHP1 based on at least a portion of the stress index codes SIC. In other words, the control circuit 500 may generate the control signal CTLs to control the voltage generator 700 such that the word-line voltages VWLs follow target levels that the memory vendor intends.

The control circuit 500 controls the page buffer circuit 410 by providing a page buffer control signal PCTL to the page buffer circuit 410 and controls the stress index generator 600 by providing a control signal GCTL to the stress index generator 600.

Figure 11:
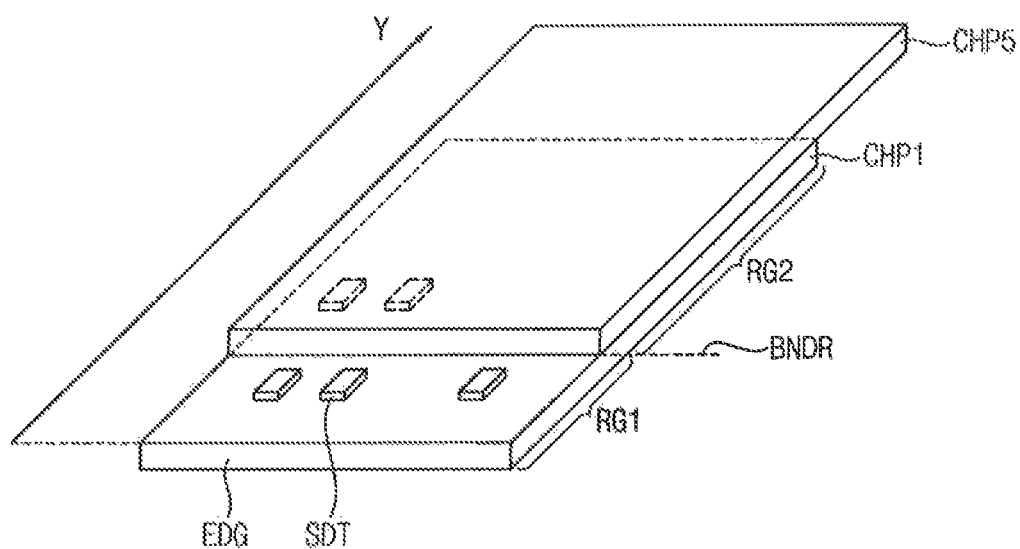
FIG. 11 illustrates a portion of the semiconductor package of FIG. 1 according to an exemplary embodiment of the inventive concept.

FIG. 11 illustrates a portion of the semiconductor package of FIG. 1 according to an exemplary embodiment of the inventive concept.

In FIG. 11, the first memory chip CHP1 and a fifth memory chip CHP5 are illustrated, and the fifth memory chip CHP5 is arranged just on the first memory chip CHP1.

A substrate of the first memory chip CHP1 may be divided into a first region RG1 and a second region RG2 from an edge of the first memory chip CHP1, with respect to a boundary BNDR. The fifth memory chip CHP5 is stacked on the first memory chip CHP1 from the boundary BNDR. In other words, the fifth memory chip CHP5 is overlapped with the first memory chip CHP1 from the boundary BNDR. The first region RG1 may be referred to as an edge region, and a peripheral circuit and a core circuit of the first memory chip CH1 may be mounted in the second region RG2. The stress detectors SDT may be formed in the substrate in each of the first memory chip CHP1 and the fifth memory chip CHP5, and may be distributed in the substrate in each of the first memory chip CHP1 and the fifth memory chip CHP5. The stress detectors SDT may be formed around the boundary BNDR. The stress detectors SDT may be n+ active resistors that are formed by using n+ doping regions around the boundary BNDR. The stress detectors SDT may output stress index codes which vary based on a distance Y from the edge EDG and the stress index codes may be provided to the storage controller 110 in FIG. 2 as the stress profile 140.

Figure 12:
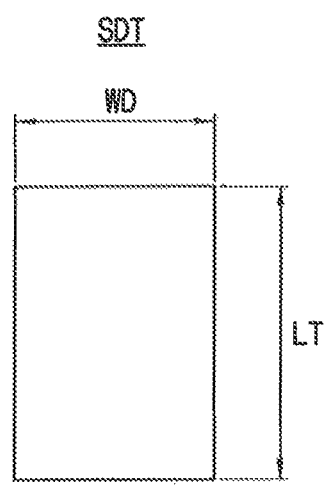
FIG. 12 illustrates a stress detector of FIG. 11 according to an exemplary embodiment of the inventive concept.

FIG. 12 illustrates a stress detector of FIG. 11 according to an exemplary embodiment of the inventive concept.

Referring to FIG. 12, the stress detector SDT may have a rectangular shape defined by a width WD and a length LT and may be implemented with a resistor that has a resistance corresponding to the width WD and the length LT.

Figure 13:
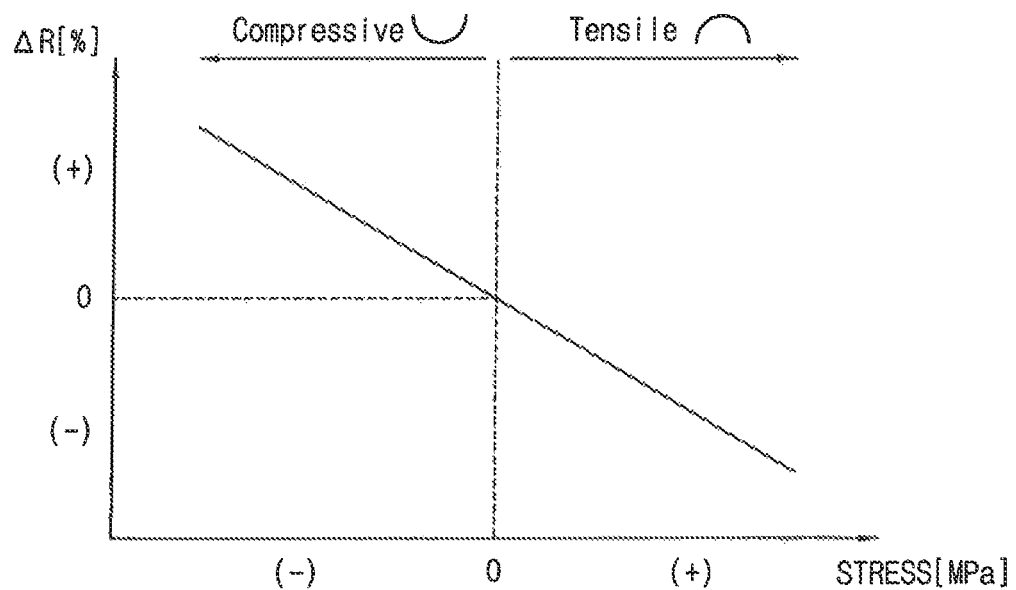
FIG. 13 illustrates a change of resistance of the stress detector of FIG. 12 according to stress when the stress detector is implemented with an n+ active resistor according to an exemplary embodiment of the inventive concept.

FIG. 13 illustrates a change of resistance of the stress detector of FIG. 12 according to stress when the stress detector is implemented with an n+ active resistor according to an exemplary embodiment of the inventive concept.

Referring to FIG. 13, when the stress detector SDT is implemented with an n+ active resistor, a magnitude of a stress MPa and a bending direction of the substrate may be notable based on a magnitude and a sign of the change ΔR of resistance. In FIG. 13, compressive denotes that the substrate bends in a downward direction and tensile denotes that the substrate bends in an upward direction.

Figure 14:
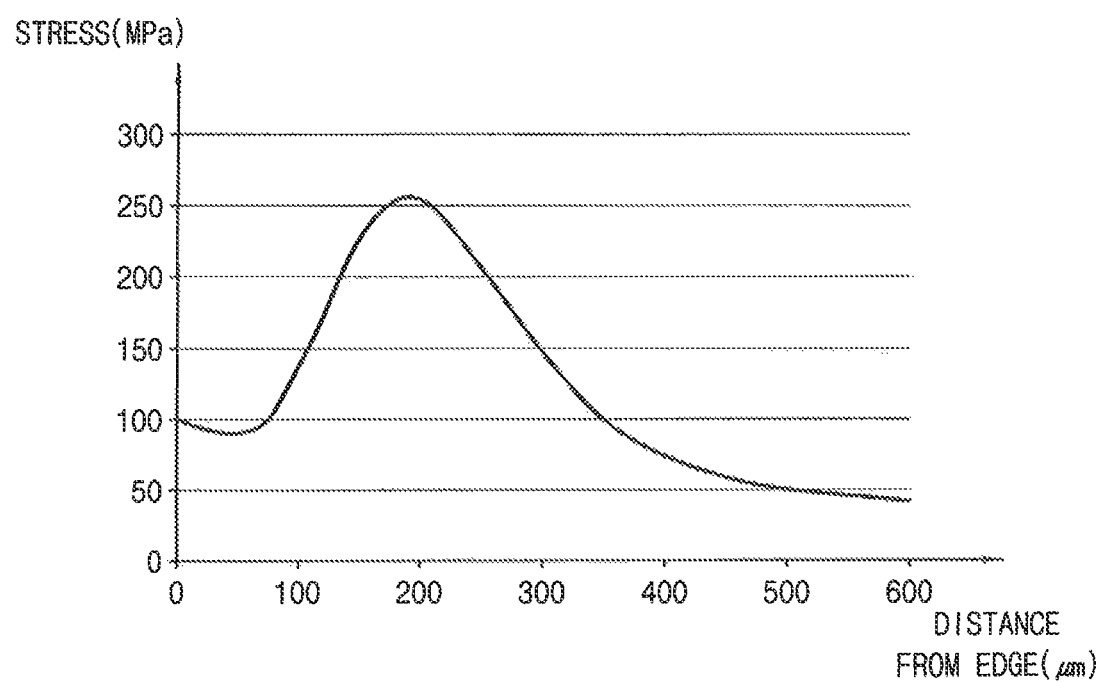
FIG. 14 illustrates a stress profile according to a distance from an edge of the substrate when the stress detector of FIG. 12 is implemented with an n+ active resistor according to an exemplary embodiment of the inventive concept.

FIG. 14 illustrates a stress profile according to a distance from an edge of the substrate when the stress detector of FIG. 12 is implemented with an n+ active resistor according to an exemplary embodiment of the inventive concept.

Referring to FIG. 14, when the stress detectors SDT are arranged in the substrate 311 and distributed in the substrate 311, the stress MPa according to a distance from the edge EDG of the substrate 311 in the first memory chip CHP1 may be notable from the stress profile and the stress profile of each of the memory chips in the semiconductor package 200a may be stored in the storage controller 110. The storage controller 110 may provide the host device 50 with the stress profile of each of the memory chips in the semiconductor package 200a, and the memory vendor receives the stress profile and may determine a boundary of a region in which circuits are arranged in each of memory chips included in a semiconductor package to be manufactured.

Figure 15:
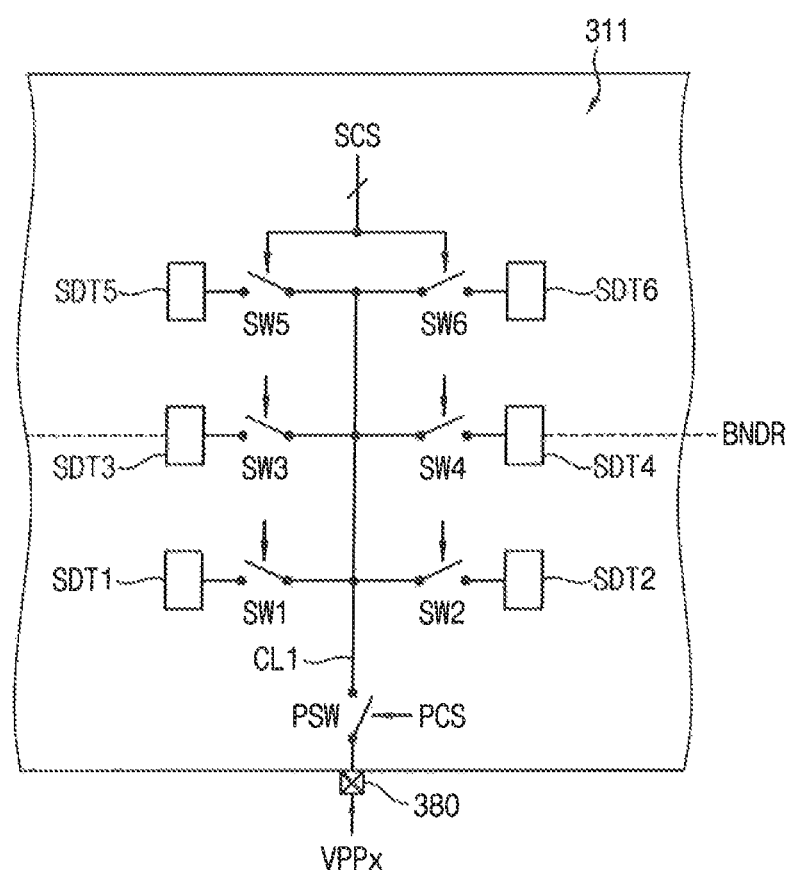
FIG. 15 illustrates stress detectors in a first memory chip of FIG. 11 according to an exemplary embodiment of the inventive concept.

FIG. 15 illustrates stress detectors in a first memory chip of FIG. 11 according to an exemplary embodiment of the inventive concept.

Referring to FIG. 15, first terminals of stress detectors SDT1~SDT6 which are arranged in the substrate 311 are coupled to a first conducting line CL1 through switches SW1~SW6, respectively. A power switch PSW coupled to a power pad 380 of the substrate 311 transfers an external voltage VPPx applied to the power pad 380 to the first conducting line CL1 in response to a power switch signal PCS. The switches SW1~SW6 are sequentially turned on in response to a switching control signal SCS and each turned-on switch transfers the external voltage VPPx to a first terminal of a corresponding stress detector SDT. The corresponding stress detector SDT may output a sensing current SI at a second terminal of the stress detector SDT in response to the external voltage VPPx. The switching control signal SCS may be provided from the control circuit 500 in FIG. 6.

Figure 16:
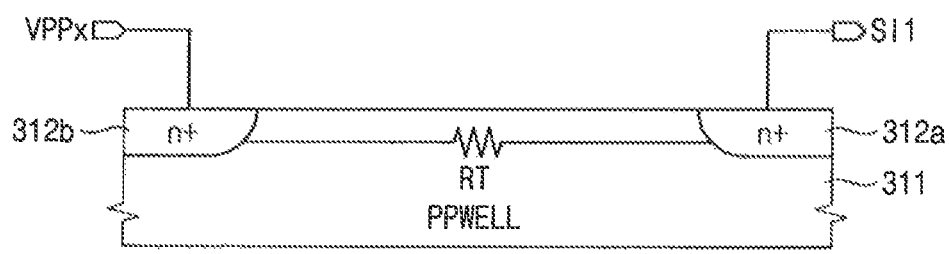
FIG. 16 illustrates a stress detector of FIG. 15 according to an exemplary embodiment of the inventive concept.

FIG. 16 illustrates a stress detector of FIG. 15 according to an exemplary embodiment of the inventive concept.

Referring to FIGS. 15 and 16, the stress detector SDT may be implemented with an n+ active resistor that uses n+ doping regions 312a and 312b formed in the substrate 311. When the external voltage VPPx is applied to the n+ doping region 312b via the switch SW1, a resistor RT is formed in the substrate 311 and a sensing current SI1 is output at the n+ doping region 312a through the resistor RT.

Figure 17:
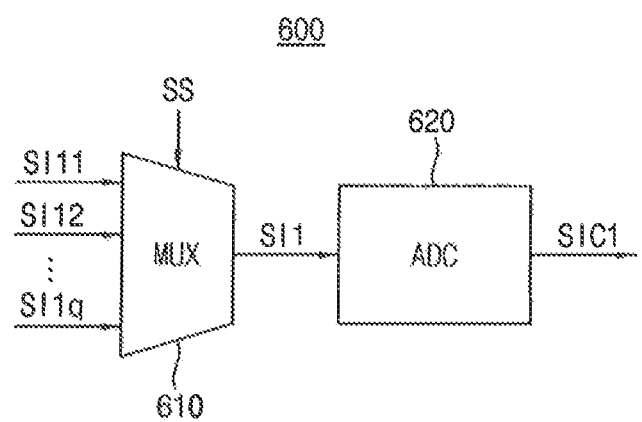
FIG. 17 is a block diagram illustrating a stress index generator in the memory chip of FIG. 6 according to an exemplary embodiment of the inventive concept.

FIG. 17 is a block diagram illustrating a stress index generator in the memory chip of FIG. 6 according to an exemplary embodiment of the inventive concept.

Referring to FIG. 17, the stress index generator 600 may include a multiplexer 610 and an analog-to-digital converter (ADC) 620.

The multiplexer 610 receives sensing currents SI11~SI1q, and selects one of the sensing currents SI1~SI1q as a first sensing current SI1 in response to a selection signal SS. The ADC 620 converts the first sensing current SI1 to a corresponding first stress index code SIC1 by performing an analog-to-digital conversion operation on the first sensing current SI1.

Figure 18:
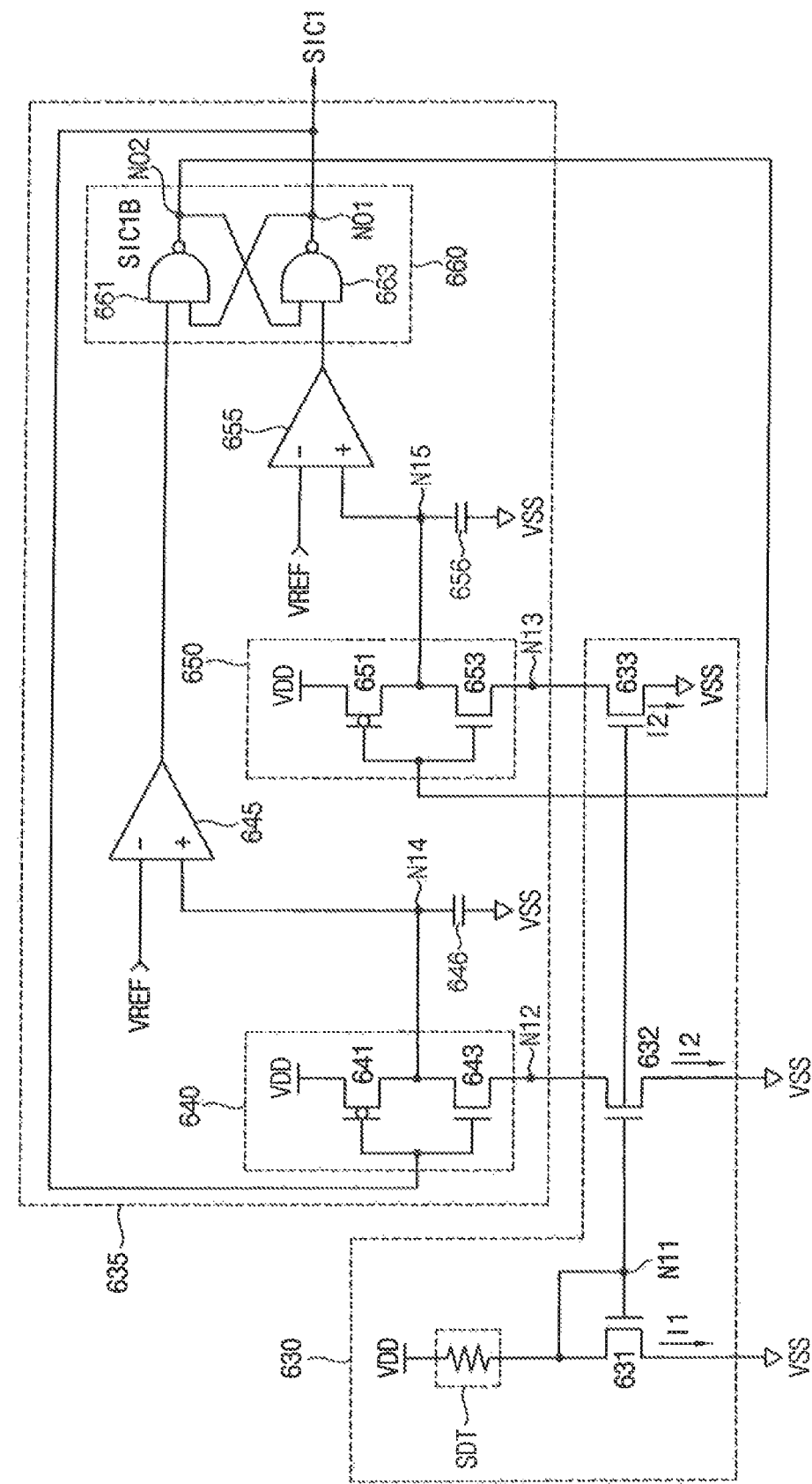
FIG. 18 illustrates an analog-to-digital converter (ADC) of FIG. 17 according to an exemplary embodiment of the inventive concept.

FIG. 18 illustrates an ADC of FIG. 17 according to an exemplary embodiment of the inventive concept.

Referring to FIG. 18, the ADC 620 may be implemented with a relaxation oscillator and the ADC 620 may include a division current generator 630 and a code generation circuit 635. The division current generator 630 is connected to the code generation circuit 635 at nodes N12 and N13.

The division current generator 630 is implemented with a parallel type current mirror, mirrors the first sensing current SI1, and provides a second current I2 at the nodes N12 and N13. The second current I2 has 1/n magnitude of the first sensing current SI1 and n is a natural number greater than one.

In FIG. 18, it is illustrated that the stress detector SDR is located in the division current generator 630 for convenience of explanation. However, the stress detector SDR may be located outside of the ADC 620. In addition, the external voltage VPPx in FIG. 16 is represented as a power supply voltage VDD in FIG. 18.

The division current generator 630 includes n-channel metal-oxide semiconductor (NMOS) transistors 631, 632, and 633 constituting the parallel type current mirror. Each of the NMOS transistors 632 and 633 and the NMOS transistor 631 may have a size ratio of 1:n. The NMOS transistor 631 receives the first sensing current SI1 at the node N11. A voltage of the node N11 corresponds to a reference voltage VREF. The NMOS transistor 632 mirrors the first sensing current SI1 by 1/n times and provides the second current I2 at the node N12. The NMOS transistor 633 mirrors the first sensing current SI1 by 1/n times and provides the second current I2 at the node N13.

The code generation circuit 635 includes a first inverter 640, a first operational amplifier 645, a first capacitor 646, a second inverter 650, a second operational amplifier 655, a second capacitor 656, and a latch 660. The latch 660 includes NAND gates 661 and 663. The latch 660 provides the first stress index code SIC1 at a first output node NO1 and provides a first inverted stress index code SIC1B at a second output node NO2. The first inverted stress index code SIC1B is an inverted version of the first stress index code SIC1.

The first inverter 640 coupled to the node N12 and the first output node NO1 and includes a p-channel metal-oxide semiconductor (PMOS) transistor 641 and an NMOS transistor 643 coupled between the power supply voltage VDD and the node N12. The first operational amplifier 645 is coupled to the first inverter 640 at a node N14, and compares the reference voltage VREF and a voltage of the node N14 to provide a first output signal to the NAND gate 661. The first capacitor 646 is coupled between the node N14 and a ground voltage VSS.

The second inverter 650 is coupled to the node N13 and the second output node NO2, and includes a PMOS transistor 651 and an NMOS transistor 653 coupled between the power supply voltage VDD and the node N13. The second operational amplifier 655 is coupled to the second inverter 650 at a node N15, and compares the reference voltage VREF and a voltage of the node N15 to provide a second output signal to the NAND gate 663. The second capacitor 656 is coupled between the node N15 and the ground voltage VSS.

The NAND gate 661 performs a NAND operation on an output of the first operational amplifier 645 and the first stress index code SIC1 to output the first inverted stress index code SIC1B at the second output node NO2. The NAND gate 663 performs a NAND operation on an output of the second operational amplifier 655 and the first inverted stress index code SIC1B to output the first stress index code SIC1 at the first output node NO1.

Therefore, when a resistance of the stress detector SDT corresponds to R, and each capacitance of the first and second capacitors 646 and 656 corresponds to C, the first sensing current SI1 has a value corresponding to (VDD−VREF)/R. When a period of the first stress index code SIC1 corresponds to T1, T1=C*R=C*(VDD−VREF)/I2, and I2=SI1/n, T1 may be represented as Expression 1:

$$T1 = n*R*C \qquad \text{[Expression 1]}$$

In Expression 1, since R denotes a value due to the stacking stress, the period T1 of the first stress index code SIC1 increases as the stacking stress increases. Therefore, a change of a stacking stress of a position at which the stress detector is located may be notable based on a change of the period of the stress index code SIC. Therefore, the stress index code SIC may be a clock signal.

Stress may be detected by using the stress detectors SDT1~SDTq at a wafer level before the semiconductor package 200a is packaged, and the detected stress may be stored in a memory cell array of a corresponding memory chip.

Figure 19:
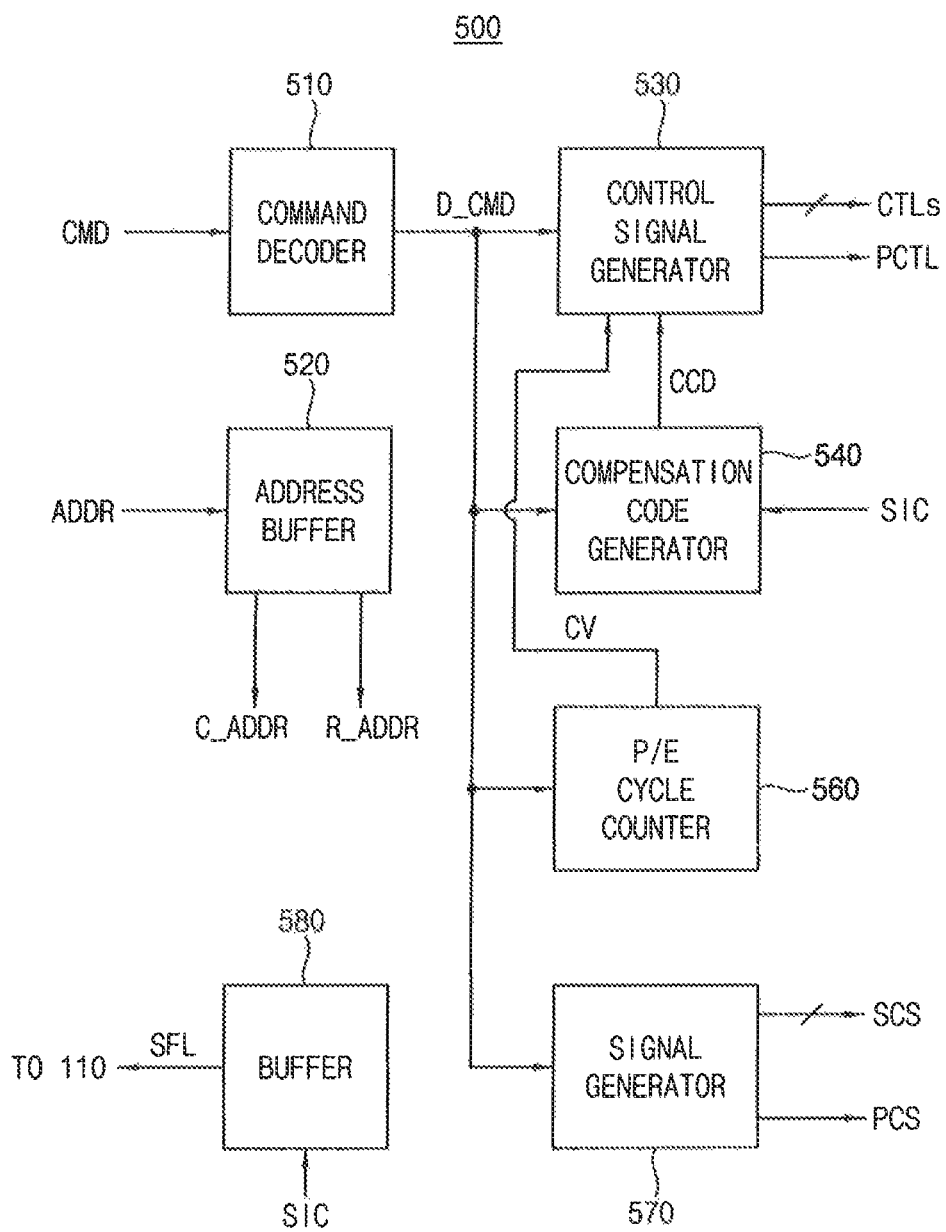
FIG. 19 is a block diagram illustrating a control circuit in the memory chip of FIG. 6 according to an exemplary embodiment of the inventive concept.

FIG. 19 is a block diagram illustrating a control circuit in the memory chip of FIG. 6 according to an exemplary embodiment of the inventive concept.

Referring to FIG. 19, the control circuit 500 includes a command decoder 510, an address buffer 520, a control signal generator 530, a compensation code generator 540, program/erase cycle counter 560, a signal generator 570, and a buffer 580.

The command decoder 510 decodes the command CMD and provides a decoded command D_CMD to the control signal generator 530, the compensation code generator 540, and the signal generator 570. The command decoder 510 provides the decoded command D_CMD to the program/erase cycle counter 560 when the decoded command D_CMD is a program command or an erase command.

The address buffer 520 receives the address signal ADDR, provides the row address R_ADDR to the address decoder 430, and provides the column address C_ADDR to the data input/output circuit 420.

The compensation code generator 540 receives the stress index code SIC, generates a compensation code CCD based on the stress index code SIC, and provides the compensation code CCD to the control signal generator 530.

The program/erase cycle counter 560 counts program/erase cycles when the decoded command D_CMD is a program command or an erase command and provides the control signal generator 530 with a counted value CV indicating the counted program/erase cycles.

The signal generator 570 selectively generates the power switch signal PCS and the switching control signal SCS based on an operation designated by the decoded command D_CMD, provides the power switch signal PCS to the power switch PSW in FIG. 15, and provides the switching control signal SCS to the switches SW1~SW6 in FIG. 15.

The control signal generator 530 receives the decoded command D_CMD and the counted value CV, generates the control signals CTLs based on an operation directed by the decoded command D_CMD, and provides the control signals CTLs to the voltage generator 700. In addition, the control signal generator 530 generates the page buffer control signal PCTL based on the decoded command D_CMD and provides the page buffer control signal PCTL to the page buffer circuit 410. Furthermore, the control signal generator 530 may generate the control signals CTLs further based on the counted value CV.

The buffer 580 stores the stress index code SIC, and provides the storage controller 110 with the stress index code SIC of the stress detectors SDT1~SDTq as a stress profile SFL.

Figure 20:
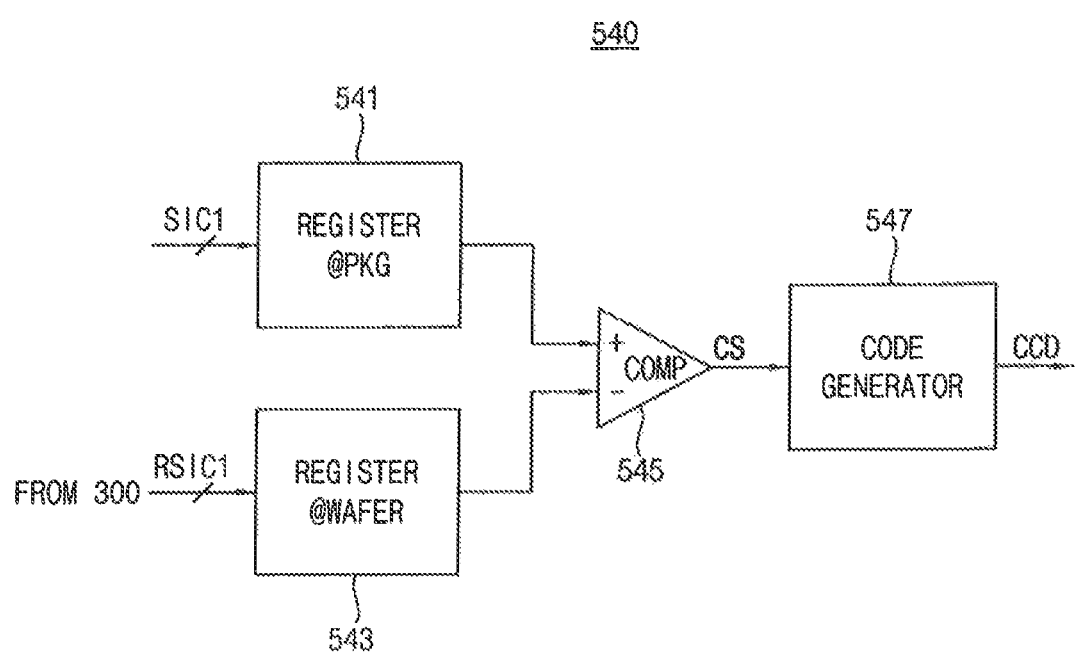
FIG. 20 is a block diagram illustrating a compensation code generator of FIG. 19 according to an exemplary embodiment of the inventive concept.

FIG. 20 is a block diagram illustrating a compensation code generator of FIG. 19 according to an exemplary embodiment of the inventive concept.

Referring to FIG. 20, the compensation code generator 540 may include a first register (REGISTER @PKG) 541, a second register (REGISTER @WAFER) 543, a comparator 545, and a code generator 547.

The first register 541 stores the first stress index code SIC1 associated with the first memory chip CHP1 in the semiconductor package 200a. The second register 543 stores a first reference stress index code RSIC1 provided from the memory cell array 300. The first reference stress index code RSIC1 is a stress index code converted based on the stress detected by the stress detectors SDT1~SDTq at the wafer level before the semiconductor package 200a is packaged. Therefore, the first reference stress index code RSIC1 may represent the stress that the first memory chip CHP1 experienced at the wafer level.

The comparator 545 compares the first stress index code SIC1 with the first reference stress index code RSIC1, and outputs a comparison signal CS corresponding to a difference between the first stress index code SIC1 with the first reference stress index code RSIC1. The code generator 547 receives the comparison signal CS, generates the compensation code CCD that reduces the difference between the first stress index code SIC1 and the first reference stress index code RSIC1, corresponding to the comparison signal CS, and provides the compensation code CCD to the control signal generator 530.

The control circuit 500 of FIG. 19 may compare at least a portion of stress index codes with a corresponding portion of reference stress index codes to adjust the value of the feature parameter such that the value of the feature parameter follows a target level of the feature parameter, which is set at the wafer level.

For example, a case where the feature parameter is a program voltage will be briefly described. A specific program voltage value (e.g., a target value), which the memory vendor designs, may be stored in a specific space (e.g., E-FUSE, etc) of the memory chip for use in a program operation. However, a physical characteristic of a memory chip may be changed due to various mechanical stresses or thermal stresses that occur in the process of stacking memory chips one upon another. In other words, a value of a program voltage, which is practically generated in a memory chip, may be different from a value (e.g., a target value) of a program voltage that the memory vendor designs. If a program voltage designed by the memory vendor is not generated normally, a program fail may occur, or it may be difficult to program memory cells to desired target program states. Accordingly, an operation of addressing the above-described issue may be additionally performed.

However, according to exemplary embodiments of the inventive concept, when a memory chip is controlled such that a feature parameter value is substantially the same as a target value originally designed by the memory vendor, there is no need to directly control a memory cell array of each semiconductor chip (e.g., execute an additional program, additional operation for error correction, etc). Accordingly, it may be possible to more fundamentally prevent issues caused when a program voltage designed by the memory vendor is not generated. A program voltage is briefly described as an example of the feature parameter, but the inventive concept is not limited thereto.

In addition, the control circuit 500 stores the stacking stress according to a distance of the edge EDG of the memory chip (e.g., CHP1) as the stress profile SFL and provides the stress profile SFL to the storage controller 110. In addition, the control circuit 500 controls the stress detectors SDT1~SDTq based on the command CMD and an operating status of the first memory chip CHP1 such that the stress detectors SDT1~SDTq detect the stacking stress at power-on of the semiconductor package, during an idle time, or when waked up from a power saving mode.

Figure 21:
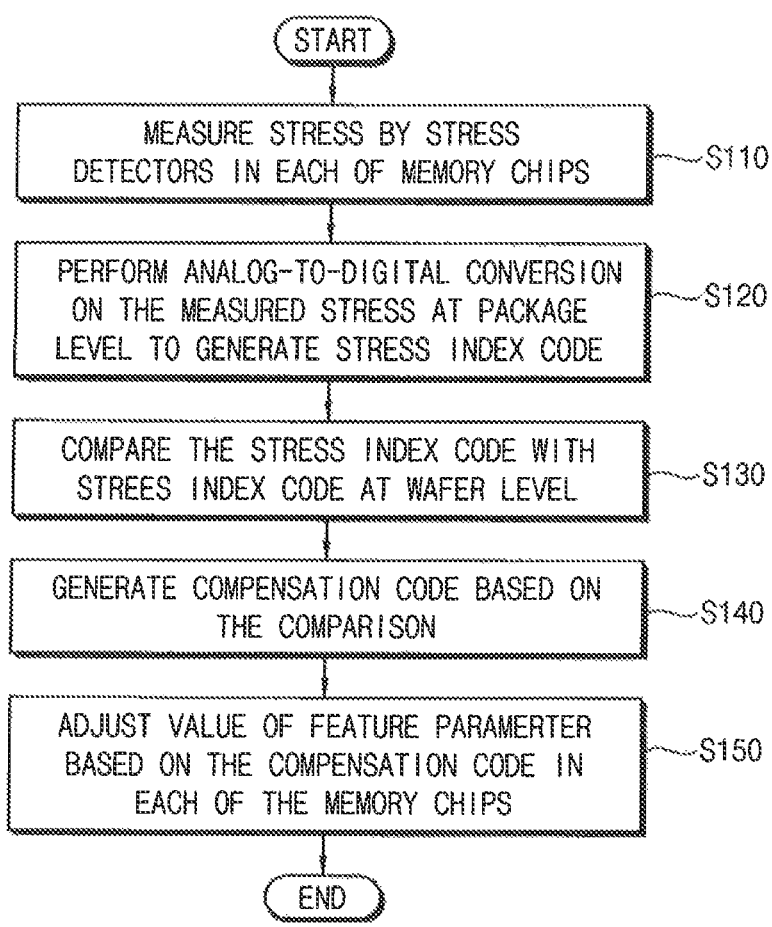
FIG. 21 is a flowchart illustrating a method of operating a semiconductor package according to an exemplary embodiment of the inventive concept.

FIG. 21 is a flowchart illustrating a method of operating a semiconductor package according to an exemplary embodiment of the inventive concept.

Referring to FIGS. 3 through 21, in a method of operating a semiconductor package which includes a plurality of memory chips which are sequentially stacked on a package substrate and include stress detectors SDT1~SDTq which are formed in a substrate, the stress detectors SDT1~SDTq, which are arranged around an edge region of the substrate detect stacking stress in response to an external voltage to output sensing currents SI1~SIq (S110).

The stress index generator 600 coupled to the stress detectors SDT1~SDTq converts the sensing currents SI1~SIq to the stress index code SIC by performing analog-to-digital conversion on the sensing currents SI1~SIq (S120).

The control circuit 500 in each of the memory chips compares at least a portion of stress index codes with a corresponding portion of reference stress index codes generated based reference sensing currents detected at a wafer level of the memory chip (S130). The control circuit 500 generates the compensation code CCD that compensates for a difference based on the comparison (S140).

The control circuit 500 generates the control signals CTLs based on the compensation code CCD and the voltage generator 700 generates the word-line voltages VWLs based on the control signals CTLs. In other words, the control circuit 500 adjusts a value of a feature parameter associated with an operating voltage based on the compensation code CCD in each of the memory chips (S150).

Figure 22:
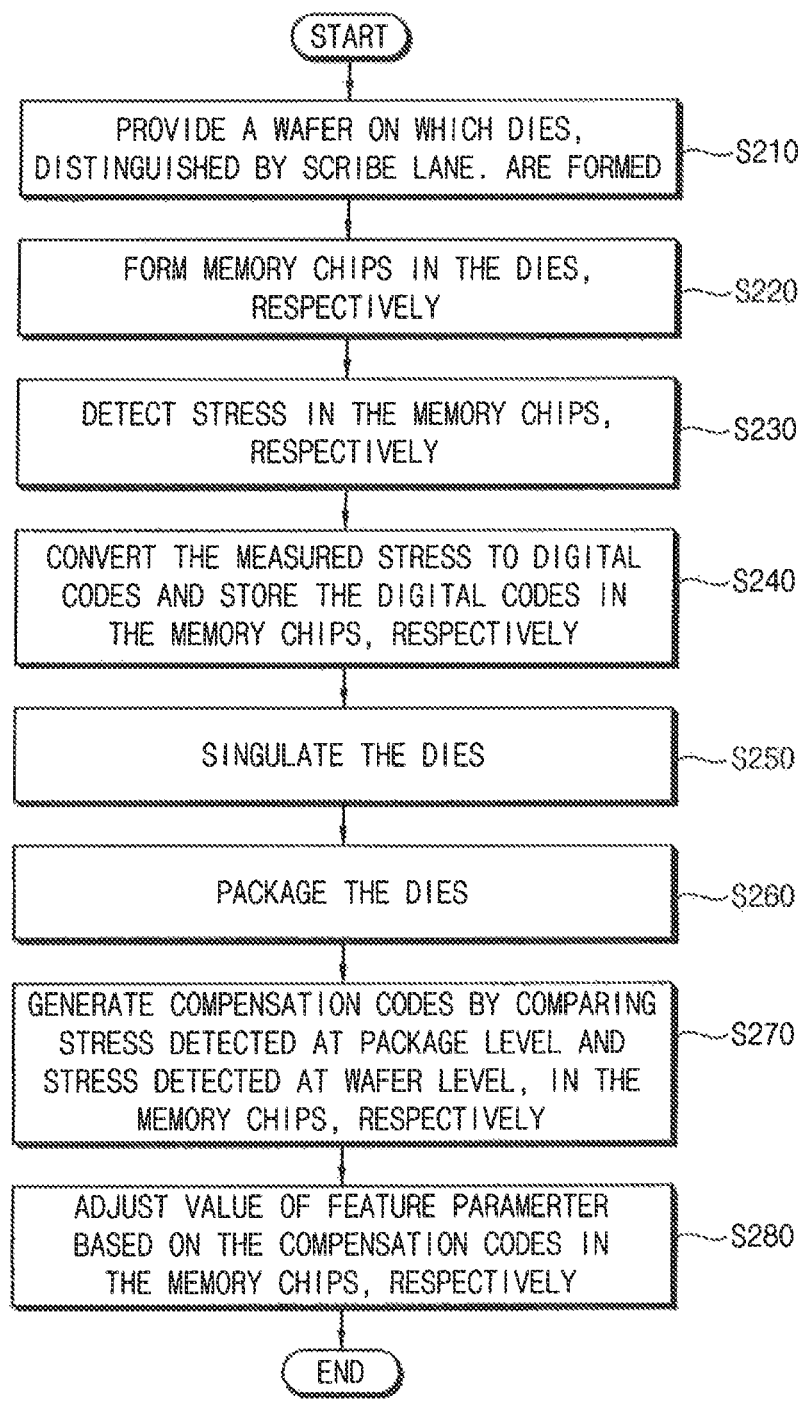
FIG. 22 is a flowchart illustrating a method of operating a semiconductor package according to an exemplary embodiment of the inventive concept.
Figure 23:
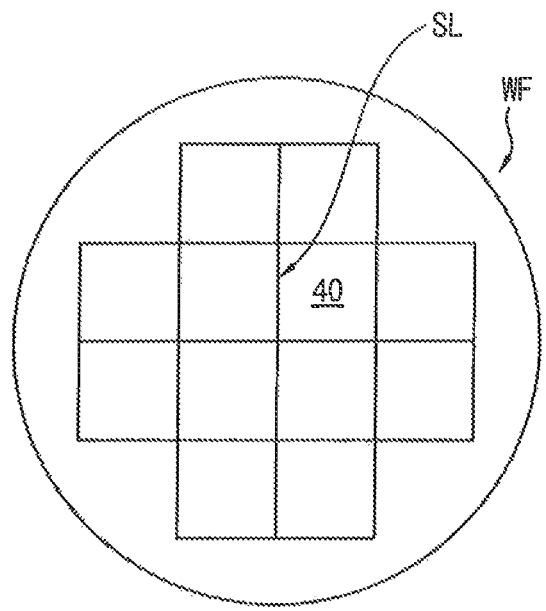
FIG. 23 is a schematic plan view of a wafer on which a plurality of memory chips are formed according to an exemplary embodiment of the inventive concept.
Figure 24:
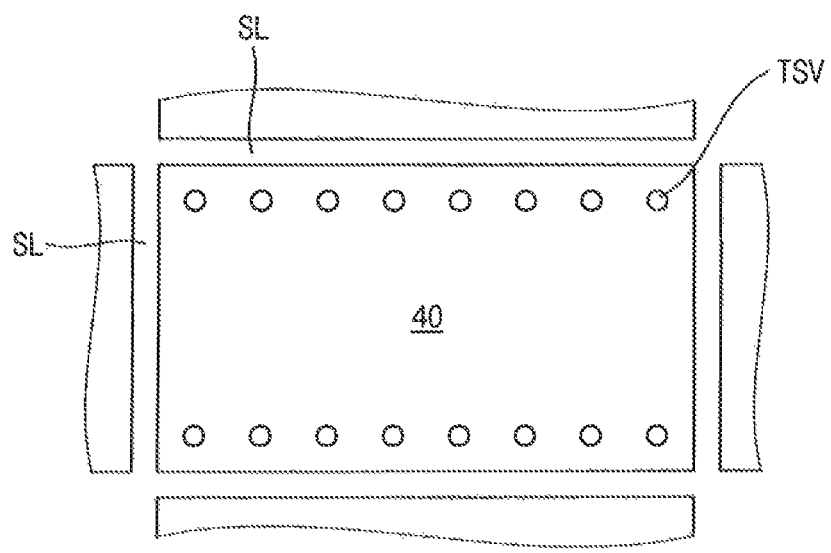
FIG. 24 is a plan view illustrating a die formed on a semiconductor wafer according to an exemplary embodiment of the inventive concept.
Figure 25:
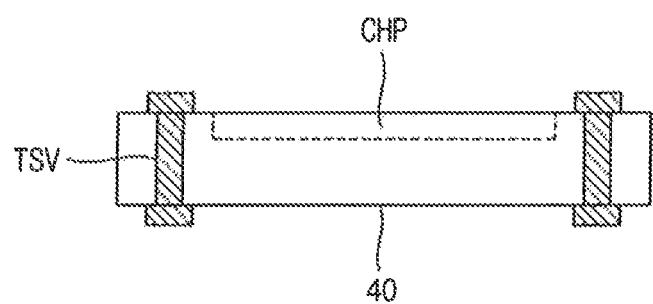
FIG. 25 is a sectional view illustrating a die according to an exemplary embodiment of the inventive concept.
Figure 26:
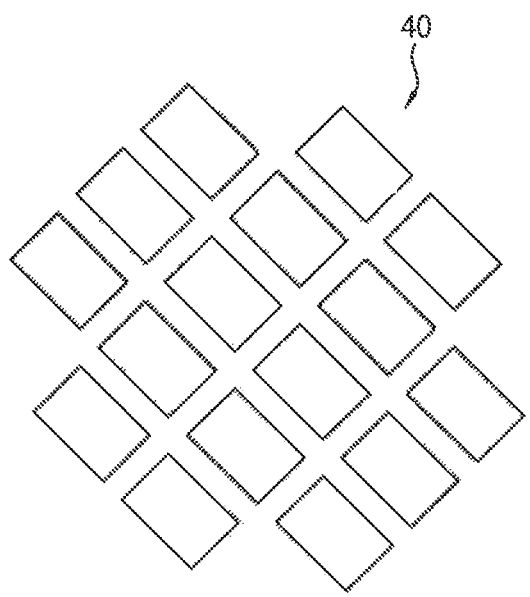
FIG. 26 is perspective view illustrating a method of fabricating a semiconductor package according to an exemplary embodiment of the inventive concept.
Figure 27:
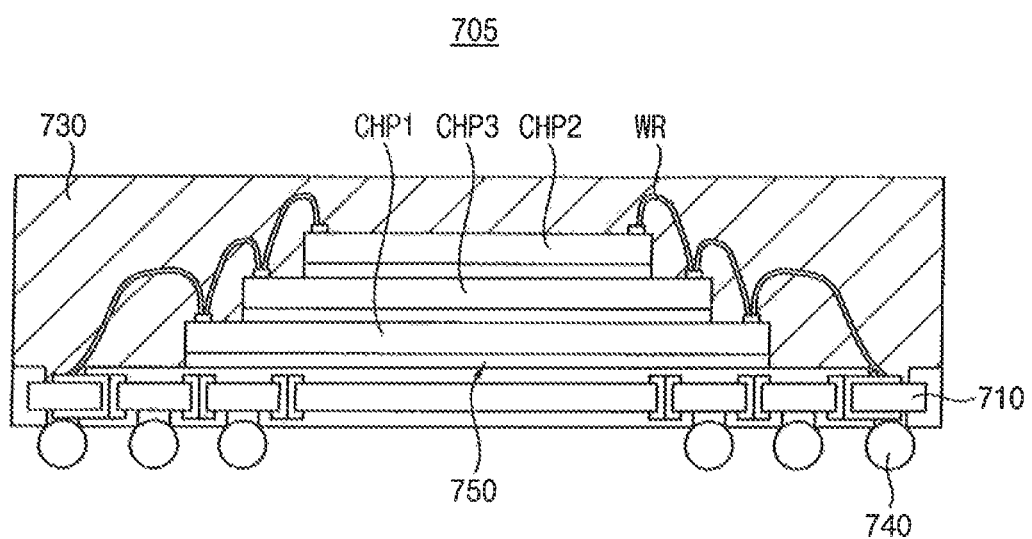
FIG. 27 illustrates a semiconductor package manufactured using a method of fabricating a semiconductor package according to an exemplary embodiment of the inventive concept.

FIG. 22 is a flowchart illustrating a method of operating a semiconductor package according to an exemplary embodiment of the inventive concept. FIG. 23 is a schematic plan view of a wafer on which a plurality of memory chips are formed according to an exemplary embodiment of the inventive concept, FIG. 24 is a plan view illustrating a die formed on a semiconductor wafer according to an exemplary embodiment of the inventive concept, and FIG. 25 is a sectional view illustrating a die according to an exemplary embodiment of the inventive concept. FIG. 26 is perspective view illustrating a method of fabricating a semiconductor package according to an exemplary embodiment of the inventive concept and FIG. 27 illustrates a semiconductor package manufactured using a method of fabricating a semiconductor package according to an exemplary embodiment of the inventive concept.

Referring to FIGS. 3 through 20, 22, and 23, there is provided a wafer WF on which a plurality of dies 40 which are separated by scribe lane SL (S210).

Referring to FIGS. 24 and 25, each die 40 may include a memory chip CHP formed on a substrate and a through silicon via TSV penetrating the substrate to electrically connect to the outside. The memory chip CHP may be a nonvolatile memory device. The through silicon via TSV may be disposed at the edge of each of the dies 40, or may be arranged at the center portion of each of the dies 40. Moreover, the through silicon via TSV penetrating the substrate may be surrounded by an insulating layer.

The memory chips are formed in each of the dies 40 (S220). The plurality of stress detectors SDT1~SDTq are formed by using n+ doping regions in a first region around an edge region of the substrate in each of the memory chips. Stress at a wafer level is detected by the stress detectors SDT1~SDTq (S230).

The stress detected at the wafer level is converted to digital codes and the digital codes are stored in a memory cell array in each of the memory chips (S240).

Referring to FIGS. 3, 22, and 26, the wafer WF is cut with respect to the scribe lane SL and the dies 40 are separated (S250). For example, a sawing process is performed on the wafer WF along the scribe lane SL and the dies 40 are separated (singulated).

Referring to FIGS. 3, 22, and 27, the dies 40 in which the memory chips are formed are stacked and a packaging process may be performed on the stacked dies (S260). The dies 40 may be bonded using an adhesive layer 750.

A semiconductor package 705 may be mounted on a package substrate 710. The semiconductor package 705 may be mounted, for example, through a flip chip bonding method.

The package substrate 710 may include various kinds of substrates including, for example, a printed circuit board, a flexible substrate, or a tape substrate. According to an exemplary embodiment of the inventive concept, the package substrate 710 may include a flexible printed circuit board including internal wires therein, a rigid printed circuit board, or a combination thereof.

The package substrate 710 has a top surface and a bottom surface, and includes bonding pads, connection pads, and internal wires. The bonding pads are arranged on the top surface of the package substrate 710, and may be electrically connected to the memory chips CHP1~CHP3 through bumps. For example, the bonding pads on the top surface of the package substrate 710 may be connected to the through silicon vias TSV of the dies 40 through the bumps. The connection pads may be arranged on the bottom surface of the package substrate 710, and may be electrically connected to the bonding pads through the internal wires. Moreover, external connection terminals 740 (e.g., conductive bumps or balls such as solder balls) connecting the semiconductor package 705 to an external electronic device may be attached to the connection pads. The memory chips CHP1~CHP3 are coupled to the package substrate 710 through wire WR.

Furthermore, the semiconductor package 705 mounted on the package substrate 710 may be molded by a molding layer 730. The molding layer 730 may additionally form an underfill layer between the package substrate 710 and the semiconductor package 705.

The control circuit 500 in each of the memory chips generates the compensation code CCD based on comparing a stress index code and a reference stress index code (S260). The stress index code is generated based on stresses detected by the stress detectors SDT1~SDTq in each of the memory chips at a package level. The control circuit 500 adjusts a value of a feature parameter associated with an operating voltage based on the compensation code CCD in each of the memory chips (S270).

The stress detectors SDT1~SDTq are n+ active resistors formed by using n+ doping regions around the edge region in each memory chip. The feature parameter includes at least one of a program voltage, a verification voltage, a read voltage, an erase voltage, or a pass voltage on each of the memory chips. The control circuit 500 compares at least a portion of stress index codes with a corresponding portion of the reference stress index codes to adjust the value of the feature parameter such that the value of the feature parameter follows a target level of the feature parameter, which is set at a wafer level.

A semiconductor package and a storage device according to exemplary embodiments of the inventive concept may be packaged using various package types or package configurations.

The inventive concept may be applied to various electronic devices. For example, the inventive concept may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

Accordingly, a semiconductor package according to exemplary embodiments of the inventive concept detects a stress applied to a memory chip by stress detectors implemented with active resistors which use doping regions in a substrate, compares the detected stress with a reference stress at a wafer level, and adjusts a value of a feature parameter such that the value of the feature parameter follows a target level of the feature parameter, which is set at the wafer level. Therefore, performance of the semiconductor package may be enhanced.

While the inventive concept has been shown and described with reference to exemplary embodiments thereof, it will be apparent to those of ordinary skill in the art that various modifications in form and details may be made thereto without materially departing from the spirit and scope of the inventive concept as set forth by the following claims.

What is claimed is:

1. A semiconductor package, comprising:
a first memory chip arranged on a package substrate;
a second memory chip arranged on the first memory chip; and
a third memory chip arranged between the first memory chip and the second memory chip,
wherein each of the first through third memory chips includes:
a memory cell array configured to store data;
a plurality of stress detectors formed and distributed in a substrate, and configured to detect stacking stress in response to an external voltage to output a plurality of sensing currents;
a stress index generator configured to convert the plurality of sensing currents into stress index codes; and
a control circuit configured to adjust a value of a feature parameter associated with an operating voltage of a corresponding memory chip, based on at least a portion of the stress index codes.

2. The semiconductor package of claim 1,
wherein the memory cell array is further configured to store reference stress index codes, and the reference stress index codes are converted based on reference sensing currents,
wherein the plurality of stress detectors detect the reference sensing currents at a wafer level before the corresponding memory chip is packaged, and
wherein the control circuit is configured to compare at least the portion of the stress index codes with a corresponding portion of the reference stress index codes to adjust the value of the feature parameter such that the value of the feature parameter follows a target level of the feature parameter, which is set at the wafer level.

3. The semiconductor package of claim 1, wherein the plurality of stress detectors correspond to n+ active resistors which are formed by using n+ doping regions of the substrate of the first through third memory chips.

4. The semiconductor package of claim 3, wherein each of the first through third memory chips further includes:
a power switch formed on the substrate, wherein the power switch is connected to a power pad which receives the external voltage;
a first conducting line coupled to the power switch;
a plurality of switches coupled between first terminals of the plurality of stress detectors and the stress index generator; and
second conducting lines coupled between the first terminals of the plurality of stress detectors and the stress index generator, and
wherein the control circuit is configured to apply a power switch control signal to the power switch and switching control signals to the plurality of switches.

5. The semiconductor package of claim 1, wherein the stress index generator includes:
a multiplexer configured to receive the plurality of sensing currents to select a first sensing current of the plurality of sensing currents in response to a selection signal; and an analog-to-digital convert (ADC) configured to convert the first sensing current to a corresponding first stress index code, and wherein the ADC implemented with a relaxation oscillator.

6. The semiconductor package of claim 5, wherein the relaxation oscillator includes:

a division current generator configured to output a second current at a first node and a second node, wherein the second current has 1/n magnitude of the first sensing current and n is a natural number greater than one; and a code generation circuit configured to generate the first stress index code based on a reference voltage, the second current, and the first stress index code, wherein the reference voltage is obtained by multiplying the first sensing current by a resistance of a first resistor of a first stress detector that generates the first sensing current, and the code generation circuit is configured to generate the first stress index code that varies based on the resistance of the first resistor, and wherein the first stress index code corresponds to a clock signal.

7. The semiconductor package of claim 6, wherein the code generation circuit includes:

a latch configured to provide the first stress index code and a first inverted stress index code at a first output node and a second output node, respectively, wherein the first inverted stress index code is an inverted version of the first stress index code;

a first inverter coupled to the division current generator at the first node and coupled to the first output node;

a first operational amplifier configured to compare an output of the first inverter and the reference voltage;

a second inverter coupled to the division current generator at the second node and coupled to the second output node; and a second operational amplifier configured to compare an output of the second inverter and the reference voltage, and wherein the latch includes:

a first NAND gate configured to perform a NAND operation on an output of the first operational amplifier and the first stress index code to output the first inverted stress index code; and a second NAND gate configured to perform a NAND operation on an output of the second operational amplifier and the first inverted stress index code to output the first stress index code.

8. The semiconductor package of claim 1, wherein the feature parameter includes at least one of a program voltage, a verification voltage, a read voltage, an erase voltage, or a pass voltage on the corresponding memory chip.

9. The semiconductor package of claim 1, wherein the control circuit is further configured to adjust the value of the feature parameter further based on program/erase cycles of the corresponding memory chip.

10. The semiconductor package of claim 1, wherein each of the first through third memory chips further includes:

an address decoder coupled to the memory cell array through a plurality of word-lines;

a page buffer circuit coupled to the memory cell array through a plurality of bit-lines; and a voltage generator configured to generate at least one of a program voltage, a verification voltage, a read voltage, an erase voltage, or a pass voltage based on a voltage provided from an outside, and wherein the control circuit is configured to control the address decoder and the page buffer circuit and is configured to control the voltage generator by applying control signals to the voltage generator.

11. The semiconductor package of claim 10, wherein the memory cell array includes a plurality of memory blocks formed along a direction substantially perpendicular to the substrate, wherein each of the plurality of memory blocks includes a plurality of cell strings, and wherein each of the plurality of cell strings is coupled to a corresponding one of the plurality of bit-lines and each of the plurality of cell strings includes a plurality of memory cells connected in series.

12. The semiconductor package of claim 10, wherein the control circuit includes:

a command decoder configured to decode a command provided from the outside to provide a decoded command;

a compensation code generator configured to generate a compensation code based on at least the portion of the stress index codes and a corresponding portion of reference stress index codes; and a control signal generator configured to generate the control signals based on the decoded command and the compensation code.

13. The semiconductor package of claim 12, wherein the control circuit further includes a program/erase cycle counter, wherein the program/erase cycle counter is configured to count program/erase cycles of the corresponding memory chip to provide a counted value, and the control signal generator is configured to generate the control signals further based on the counted value.

14. The semiconductor package of claim 1, wherein the control circuit is configured to store the stacking stress based on a distance of an edge of the substrate as a stress profile therein, and is configured to output the stress profile to an outside of the semiconductor package.

15. The semiconductor package of claim 1, wherein the control circuit is configured to adjust the value of the feature parameter by detecting the stacking stress at power-on of the semiconductor package, during an idle time, or when waked up from a power saving mode.

16. A storage device, comprising:

a semiconductor package including first through third memory chips, wherein the first memory chip is arranged on a package substrate, the second memory chip is arranged on the first memory chip, and the third memory chip is arranged between the first and second memory chips; and a storage controller configured to control the first through third memory chips, wherein each of the first through third memory chips includes:

a memory cell array configured to store data;

a plurality of stress detectors formed and distributed in a substrate, and configured to detect stacking stress to output a plurality of sensing currents;

a stress index generator configured to convert the plurality of sensing currents into stress index codes; and a control circuit configured to adjust a value of a feature parameter associated with an operating voltage of a corresponding memory chip, based on at least a portion of the stress index codes.

17. The storage device of claim 16,
wherein the memory cell array is further configured to store reference stress index codes, and the reference stress index codes are converted based on reference sensing currents,
wherein the plurality of stress detectors detect the reference sensing currents at a wafer level before the corresponding memory chip is packaged,
wherein the control circuit is configured to compare at least the portion of the stress index codes with a corresponding portion of the reference stress index codes to adjust the value of the feature parameter such that the value of the feature parameter follows a target level of the feature parameter, which is set at the wafer level, and
wherein the plurality of stress detectors correspond to n+ active resistors which are formed by using n+ doping regions of the substrate of the first through third memory chips.

18. The storage device of claim 16, wherein the stress index generator includes:
a multiplexer configured to select a first sensing current of the plurality of sensing currents in response to a selection signal; and
an analog-to-digital convert (ADC) configured to convert the first sensing current to a corresponding first stress index code,
wherein the ADC is implemented with a relaxation oscillator,
wherein the feature parameter includes at least one of a program voltage, a verification voltage, a read voltage, an erase voltage, or a pass voltage on the corresponding memory chip, and
wherein the storage controller is configured to store the stress index codes based on a distance of an edge of the substrate of each of the first through third memory chips as a stress profile therein, and is configured to output the stress profile to an external host device.

19. A method of operating a semiconductor package:
providing a wafer including a plurality of dies which are distinguished by scribe lanes;
forming memory chips in the plurality of dies;
detecting stress, by each of a plurality of stress detectors, which are formed and distributed in a substrate of each of the memory chips,
converting, in each of the memory chips, the detected stress to digital codes to store the digital codes inside of each of the memory chips as reference stress index codes;
singulating the dies from one another by cutting along the scribe lanes
stacking the singulated dies to perform a packing process on the stacked singulated dies;
comparing at least a portion of stress index codes with a corresponding portion of the reference stress index codes to generate a compensation code, wherein the stress index codes are converted based on stacking stress detected by the plurality of stress detectors in each of the memory chips; and
adjusting a value of a feature parameter of each of the memory chips based on the compensation code in each of the memory chips.

20. The method of claim 19, wherein the plurality of stress detectors correspond to n+ active resistors which are formed by using n+ doping regions of the substrate of each of the memory chips, and
wherein the feature parameter includes at least one of a program voltage, a verification voltage, a read voltage, an erase voltage, or a pass voltage on a corresponding memory chip.

* * * * *